(12) United States Patent
Ware et al.

(10) Patent No.: US 9,837,132 B2
(45) Date of Patent: Dec. 5, 2017

(54) HIGH CAPACITY MEMORY SYSTEM

(71) Applicant: RAMBUS INC., Sunnyvale, CA (US)

(72) Inventors: Frederick A. Ware, Los Altos Hills, CA (US); Suresh Rajan, Fremont, CA (US)

(73) Assignee: Rambus, Inc., Sunnyvale, CA (US)

( * ) Notice: Subject to any disclaimer, the term of this patent is extended or adjusted under 35 U.S.C. 154(b) by 0 days.

(21) Appl. No.: 15/024,454

(22) PCT Filed: Sep. 24, 2014

(86) PCT No.: PCT/US2014/057314
§ 371 (c)(1),
(2) Date: Mar. 24, 2016

(87) PCT Pub. No.: WO2015/048199
PCT Pub. Date: Apr. 2, 2015

(65) Prior Publication Data
US 2016/0217839 A1 Jul. 28, 2016

Related U.S. Application Data

(60) Provisional application No. 61/881,854, filed on Sep. 24, 2013.

(51) Int. Cl.
*G11C 5/06* (2006.01)
*G11C 7/10* (2006.01)
(Continued)

(52) U.S. Cl.
CPC ............ *G11C 7/1063* (2013.01); *G11C 5/04* (2013.01); *G11C 5/063* (2013.01); *G11C 7/1072* (2013.01);
(Continued)

(58) Field of Classification Search
CPC .............................................. H04J 2203/0012
(Continued)

(56) References Cited

U.S. PATENT DOCUMENTS 5,430,859 A * 7/1995 Norman ................ G06F 3/0613
  365/185.33
5,668,974 A * 9/1997 Grassi ................ G06F 12/0607
  710/52
(Continued)

OTHER PUBLICATIONS

Notification Concerning Transmittal of International Preliminary Report on Patentability dated Apr. 7, 2016 re Int'l. Appln. No. PCT/US14/057314. 14 Pages.
(Continued)

*Primary Examiner* — Min A Huang
(74) *Attorney, Agent, or Firm* — Lowenstein Sandler LLP

(57) ABSTRACT

The embodiments described herein describe technologies for memory systems. One implementation of a memory module includes multiple device sites coupled to the a data query (DQ) buffer component via data lines and coupled to a command and address (CA) buffer component via chip select (CS) lines. A first number of the CS lines between the CA buffer component and any combination of two or more of the multiple device sites is greater than a second number of the CS lines between the CA buffer component and a single one of the multiple device sites.

15 Claims, 21 Drawing Sheets

(51) Int. Cl.
*G11C 5/04* (2006.01)
*G11C 29/02* (2006.01)

(52) U.S. Cl.
CPC .......... *G11C 29/025* (2013.01); *G11C 29/028* (2013.01); *G11C 7/10* (2013.01)

(58) Field of Classification Search
USPC .......................................................... 710/104
See application file for complete search history.

(56) References Cited

U.S. PATENT DOCUMENTS

| | | | |
|---|---|---|---|
| 6,742,098 B1 | 5/2004 | Halbert et al. | |
| 7,296,129 B2 * | 11/2007 | Gower | G06F 13/4022 365/63 |
| 7,356,627 B2 * | 4/2008 | Haverinen | G06F 12/0661 700/24 |
| 7,577,760 B2 * | 8/2009 | Lee | G06F 13/1684 365/189.011 |
| 8,072,837 B1 * | 12/2011 | Solomon | G11C 5/04 365/149 |
| 8,130,560 B1 | 3/2012 | Rajan et al. | |
| 9,043,513 B2 * | 5/2015 | Perego | G06F 12/10 710/3 |
| 2006/0129755 A1 | 6/2006 | Raghuram | |
| 2007/0260841 A1 * | 11/2007 | Hampel | G06F 13/1684 711/167 |
| 2008/0304242 A1 * | 12/2008 | Baek | H01L 25/0657 361/735 |
| 2011/0125982 A1 * | 5/2011 | Choi | G06F 11/073 711/200 |
| 2012/0134084 A1 | 5/2012 | Perego et al. | |
| 2012/0204079 A1 | 8/2012 | Takefman et al. | |
| 2012/0326775 A1 * | 12/2012 | Heo | G11C 8/12 327/564 |
| 2013/0010556 A1 | 1/2013 | Koshizuka | |
| 2013/0058145 A1 | 3/2013 | Yu et al. | |
| 2013/0063998 A1 * | 3/2013 | Harashima | G11C 5/04 365/63 |
| 2013/0135916 A1 | 5/2013 | Osanai et al. | |
| 2013/0254495 A1 | 9/2013 | Kim et al. | |
| 2015/0103479 A1 * | 4/2015 | Ware | G11C 11/4093 361/679.31 |

OTHER PUBLICATIONS

PCT International Search Report and Written Opinion dated Dec. 24, 2014 in International Application No. PCT/US2014/057314, 15 pages.
International Search Report and Written Opinion, PCT Application No. PCT/US2014/057314, dated Dec. 24, 2014.

* cited by examiner

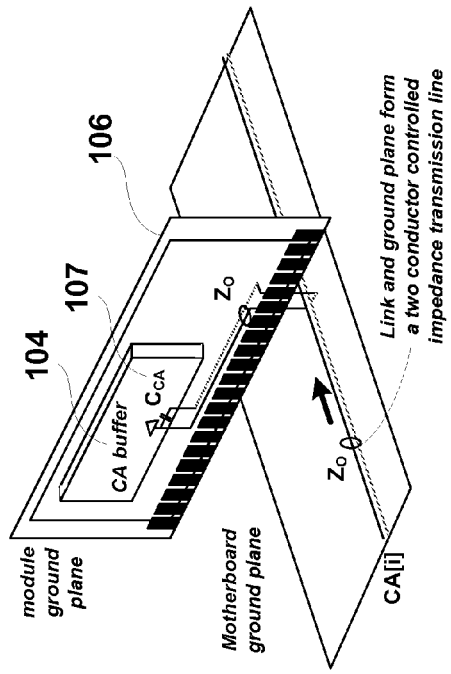
Figure 1a - DQ and CA links – Standard topology 100
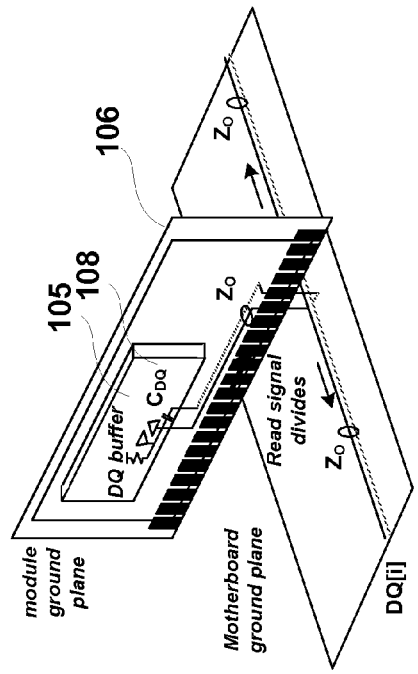
Figure 1b - CA link detail
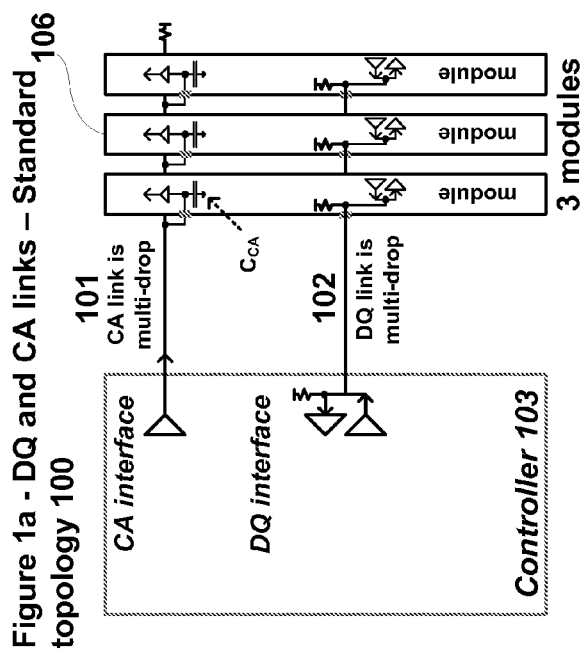
Figure 1c - DQ link detail – write access
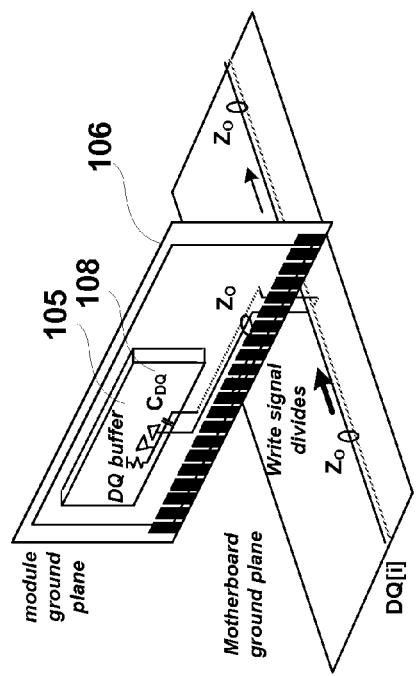
Figure 1d - DQ link detail – read access

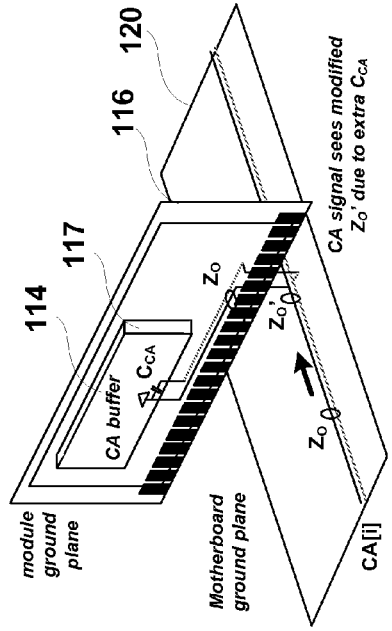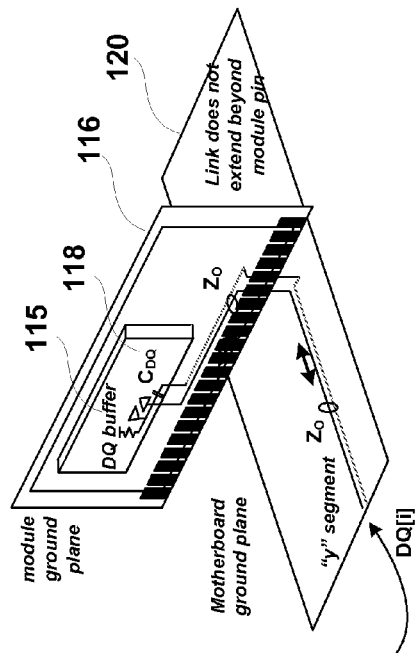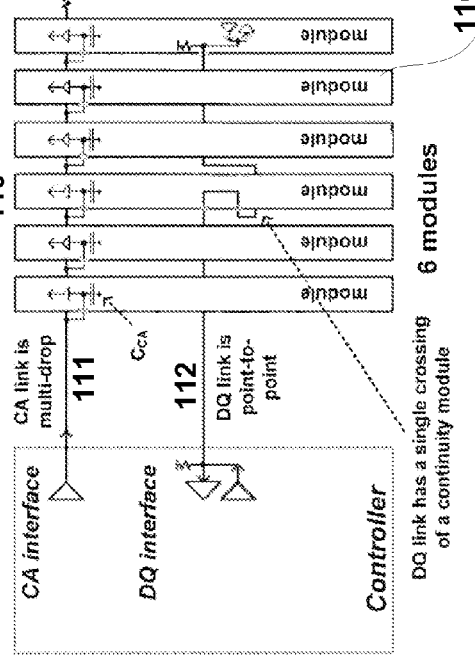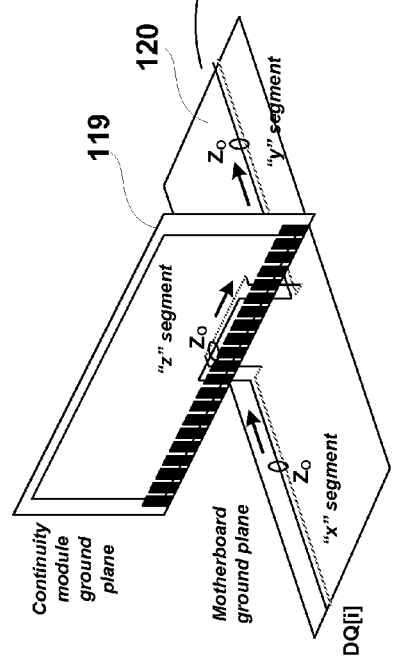

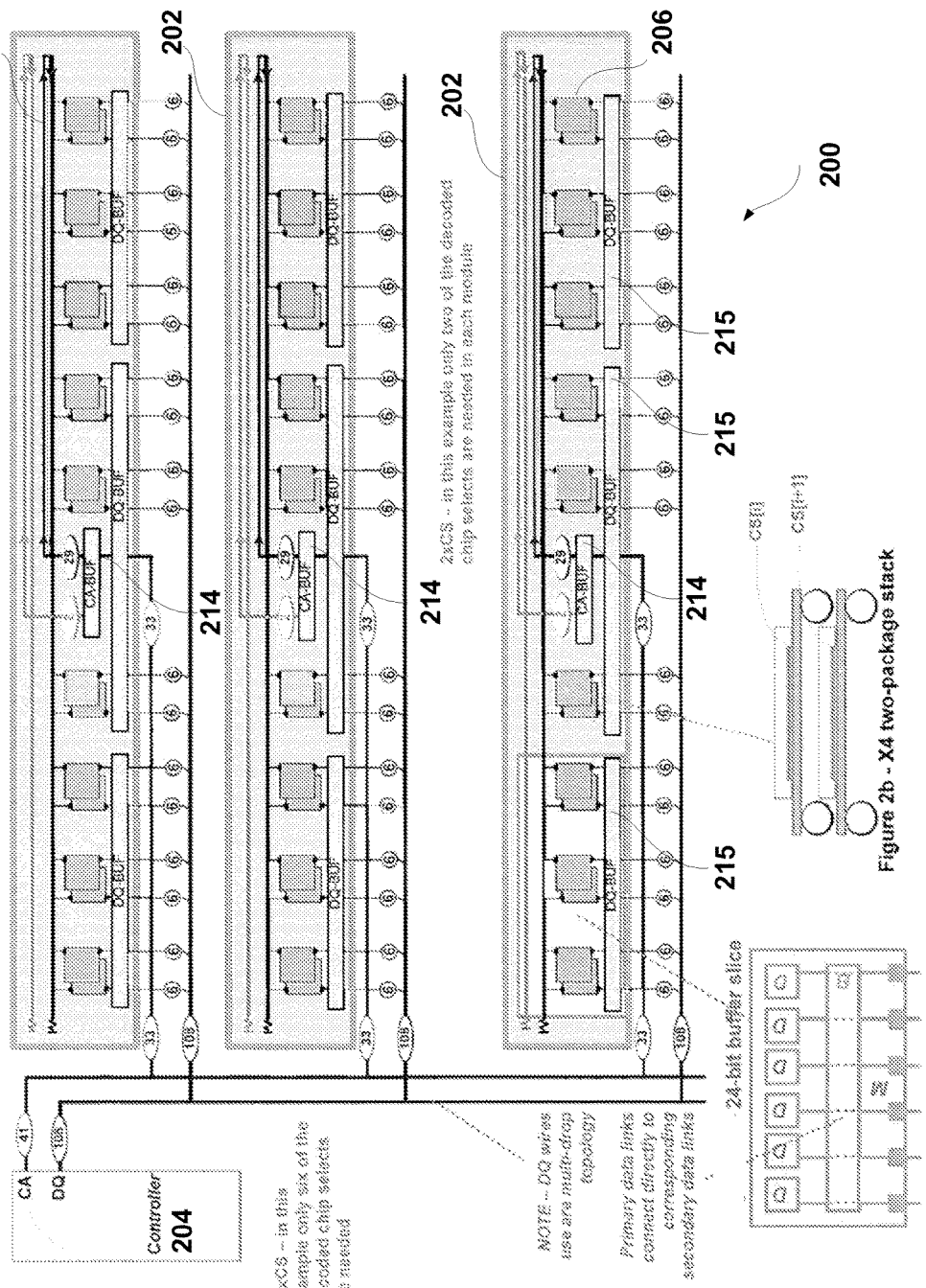

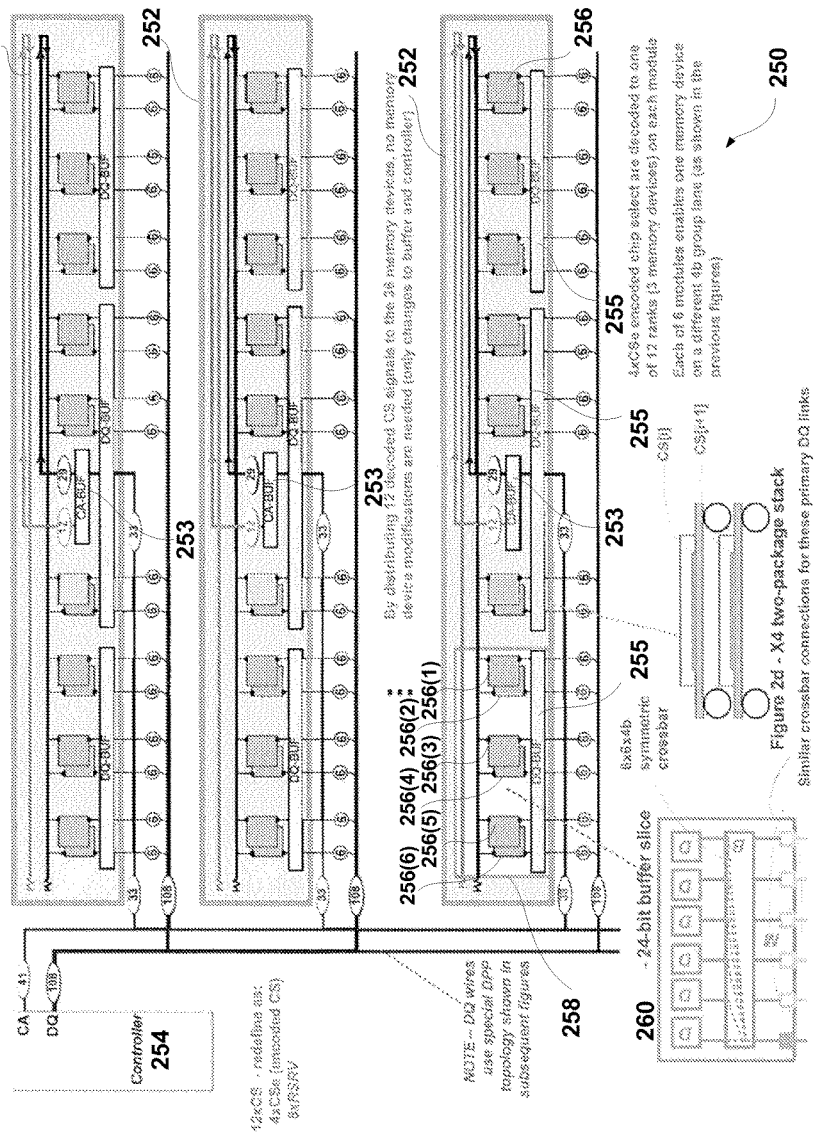

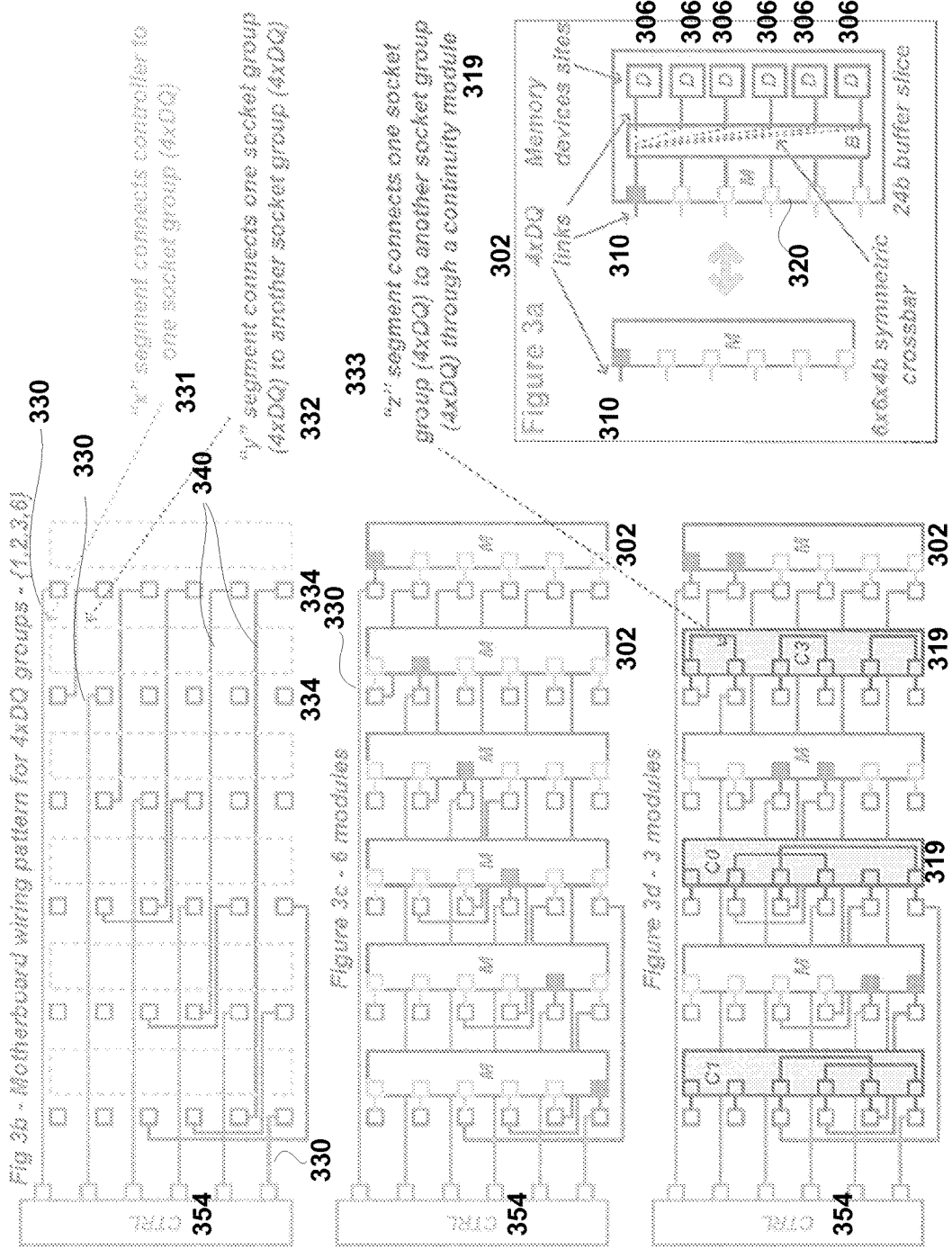

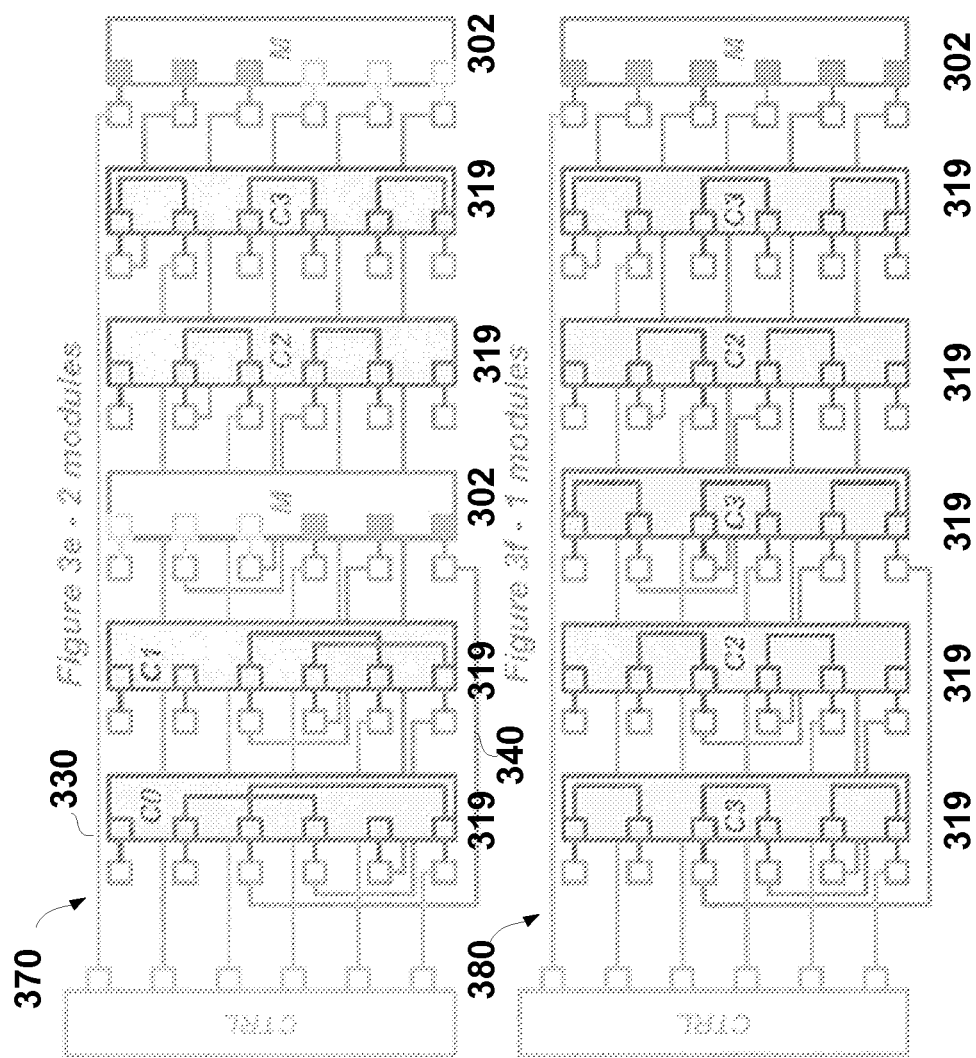

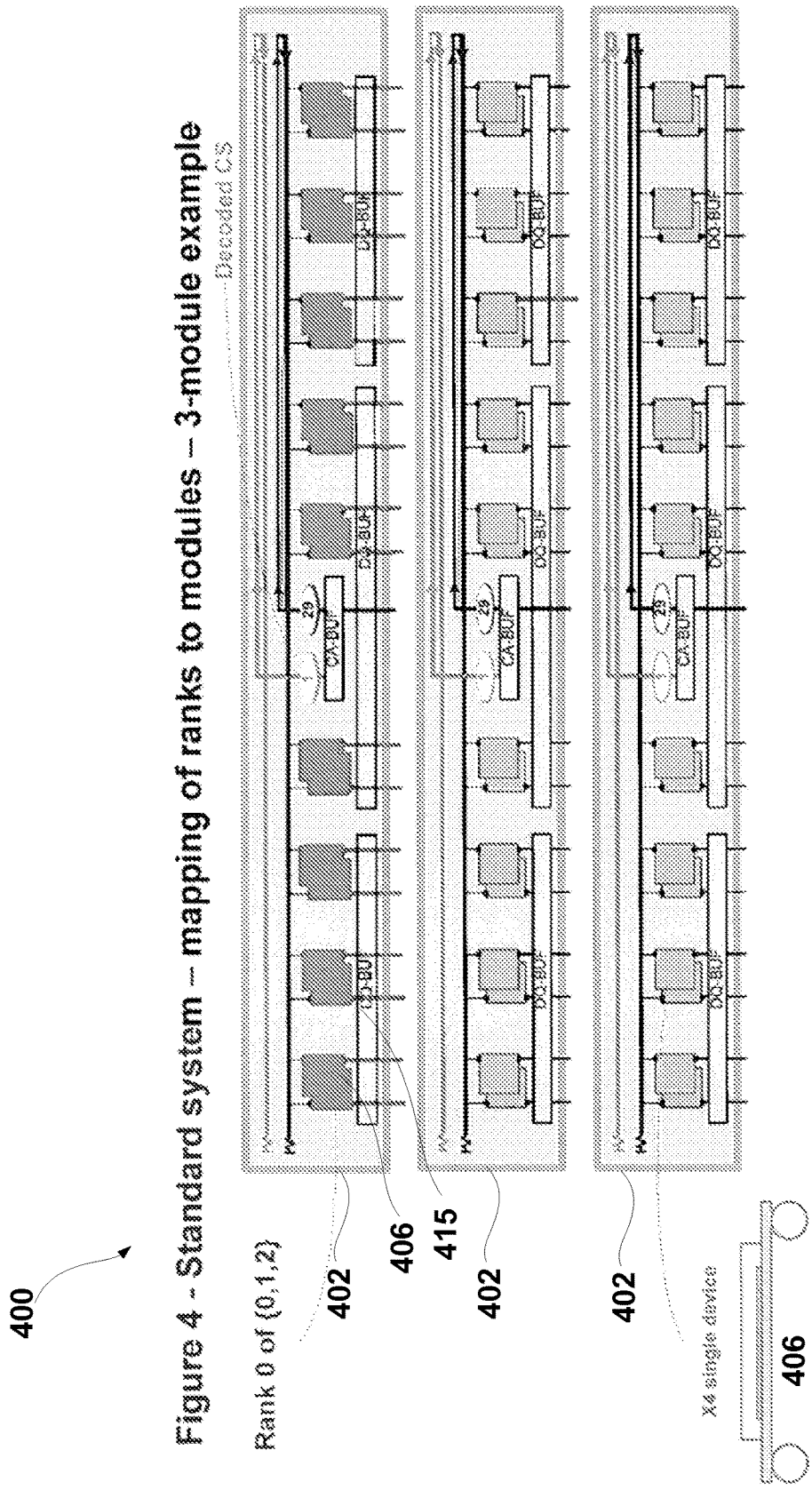
Figure 4 – Standard system – mapping of ranks to modules – 3-module example

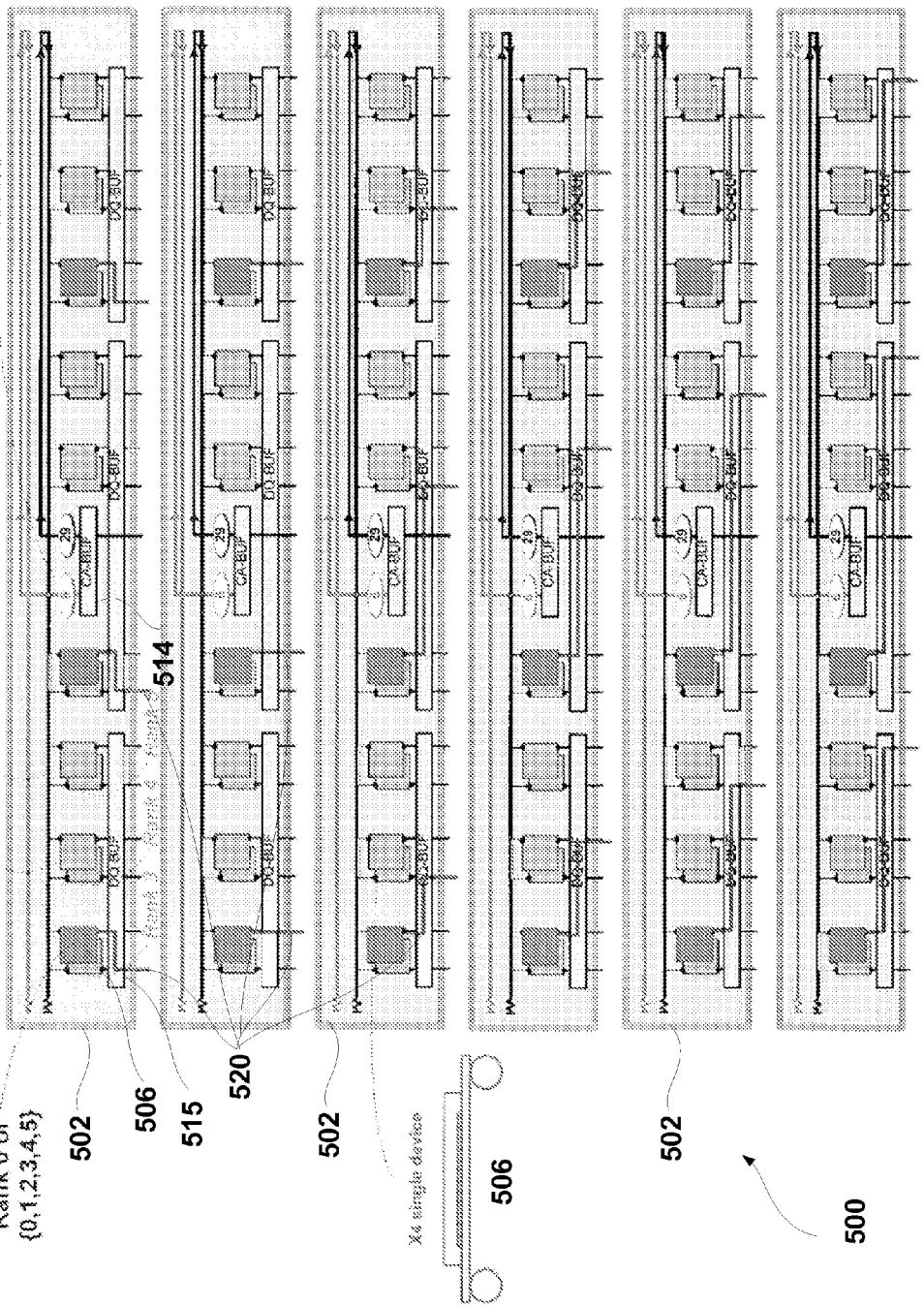

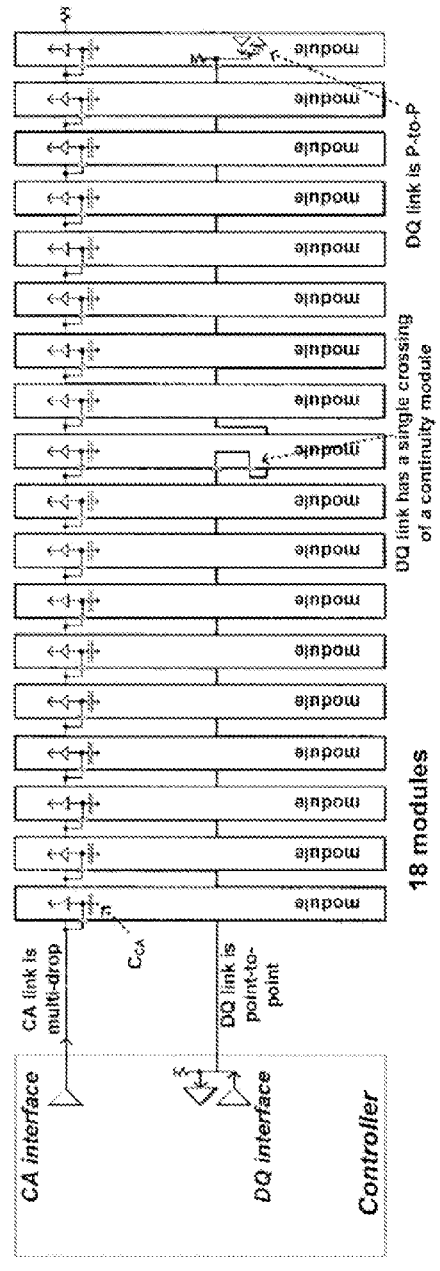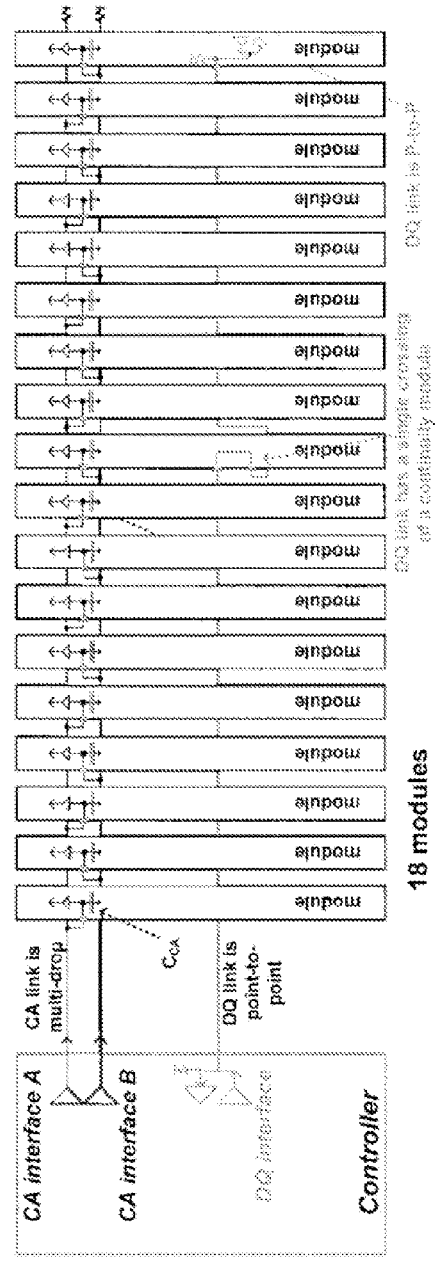

FIG. 7a - Improved system with encoded primary CS and decoded secondary CS

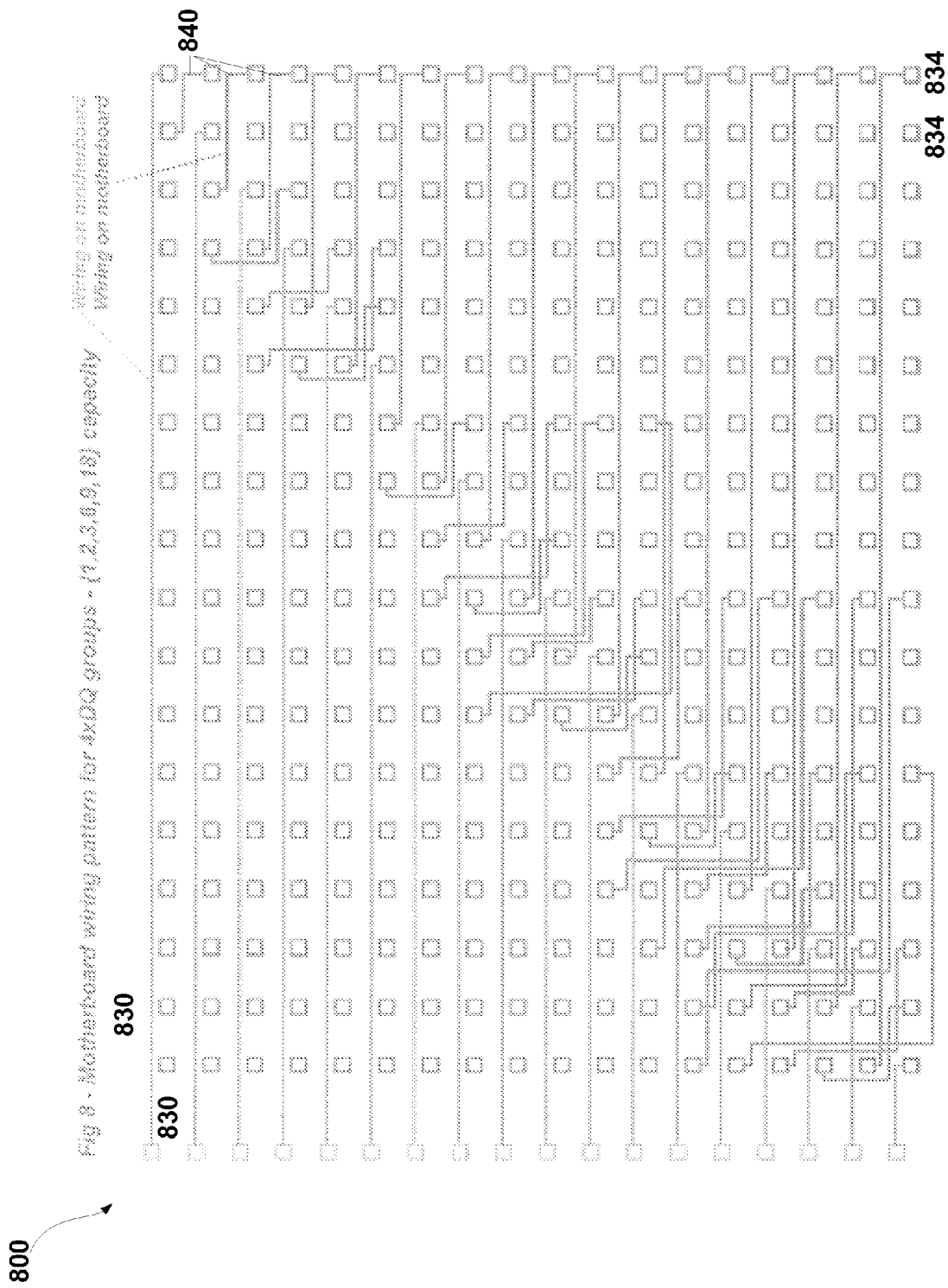

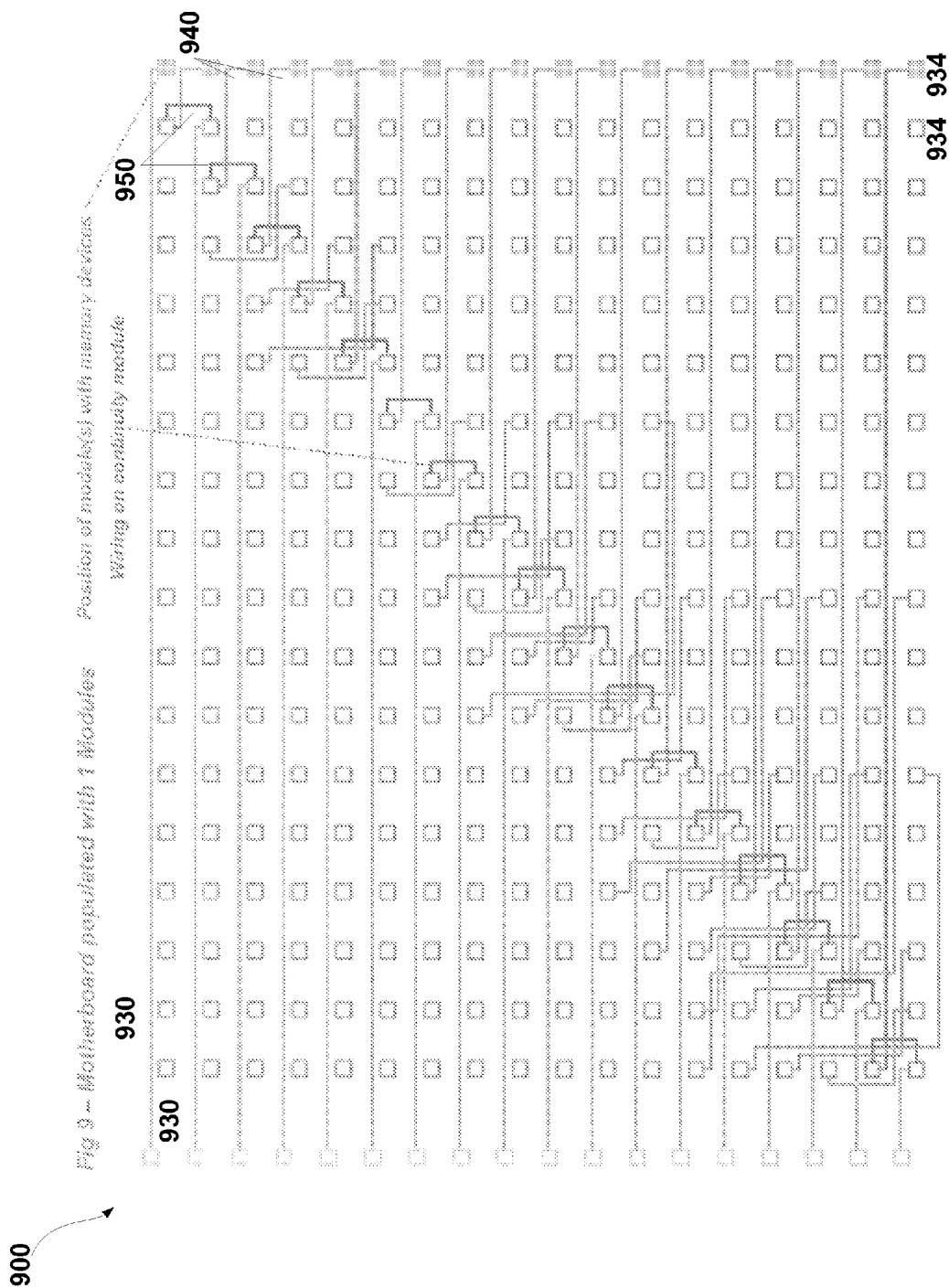

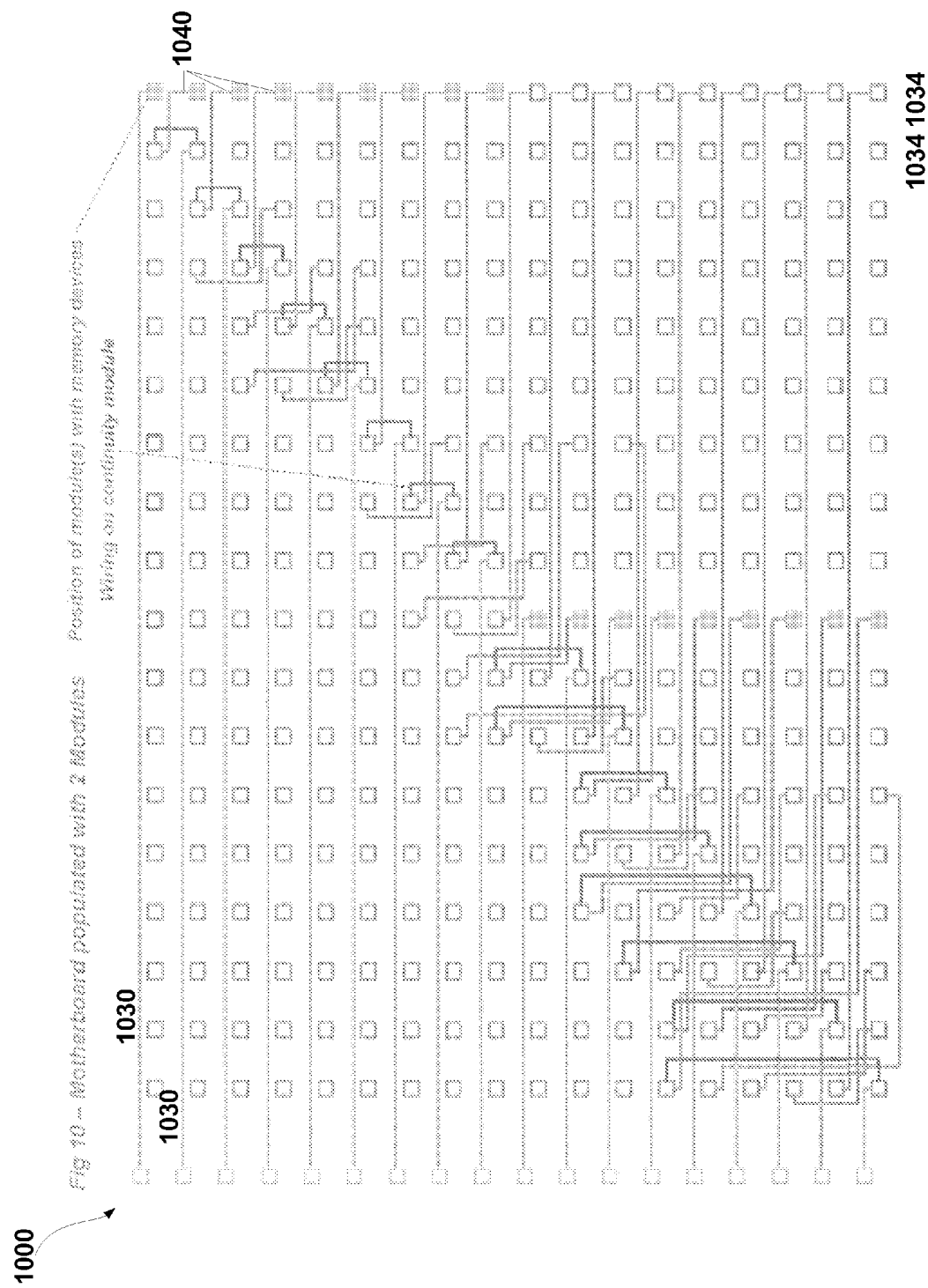

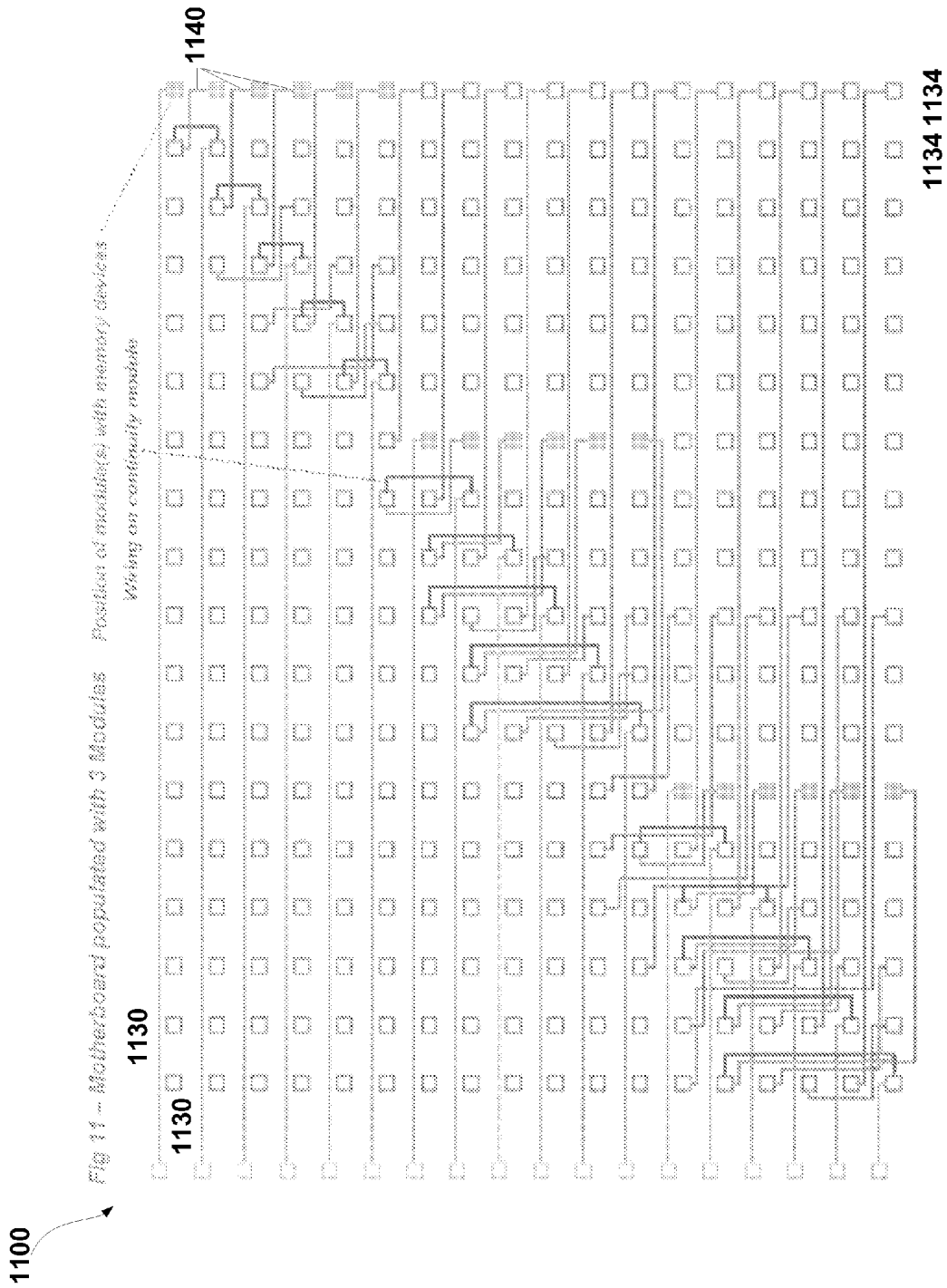

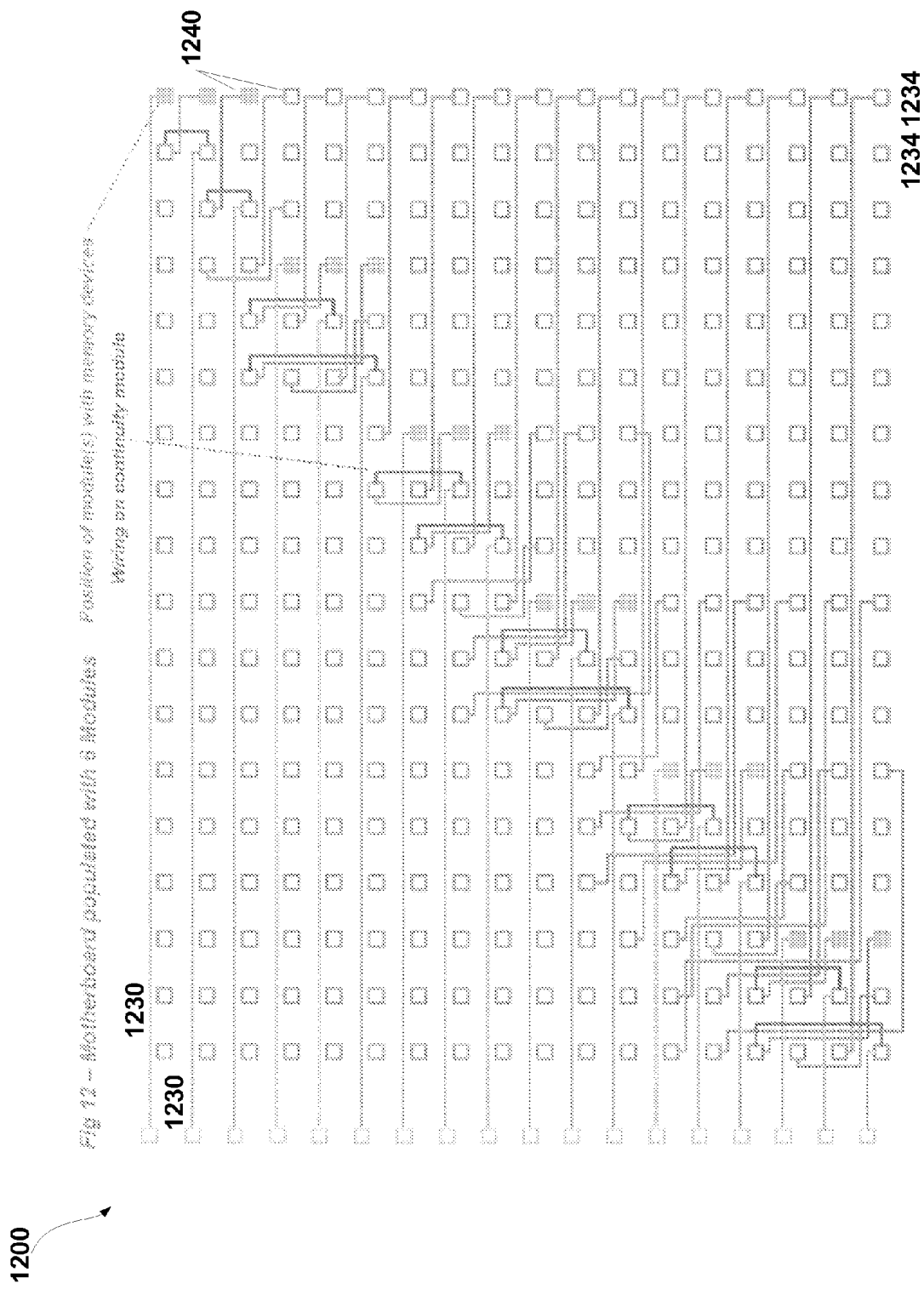

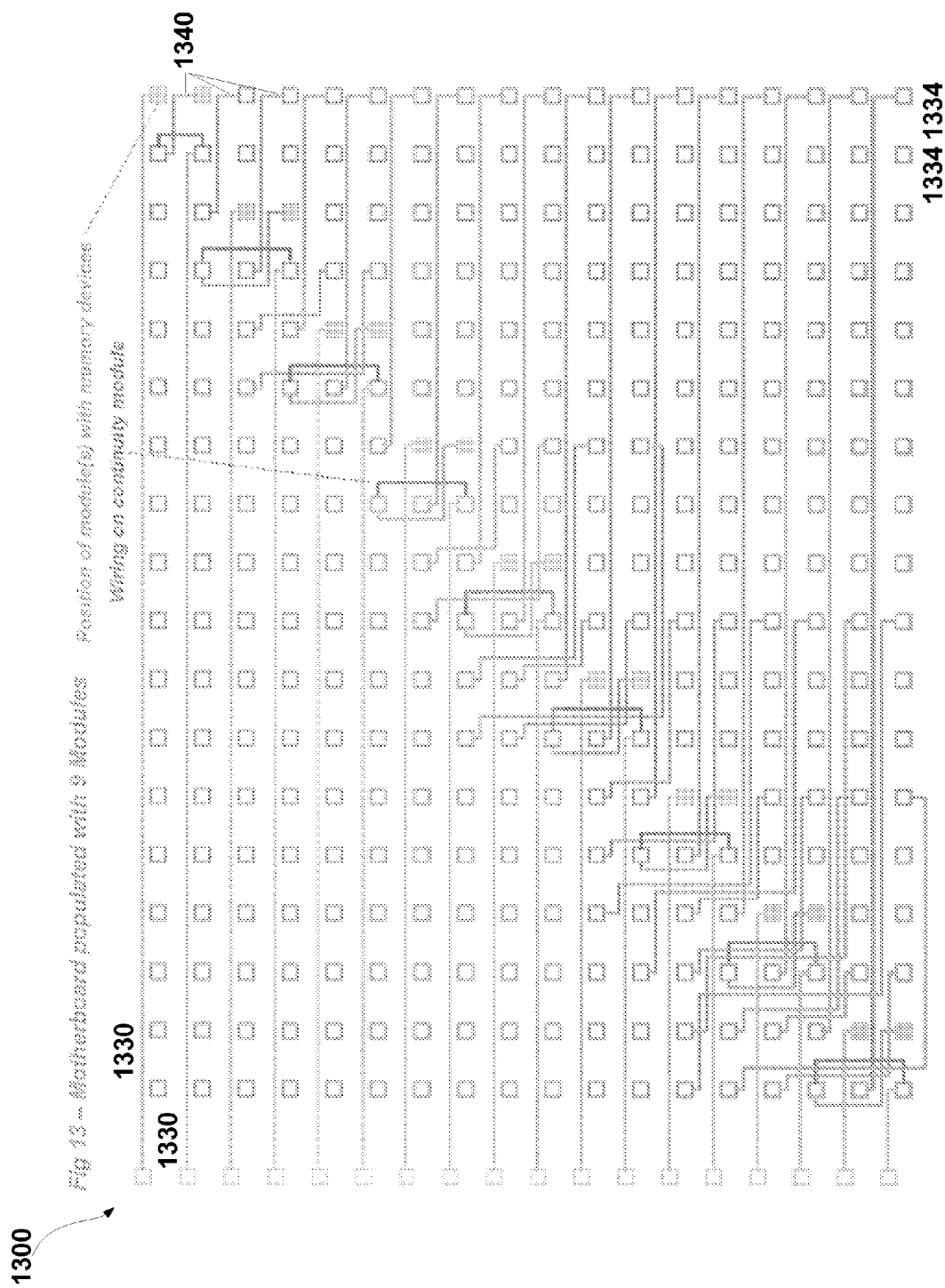

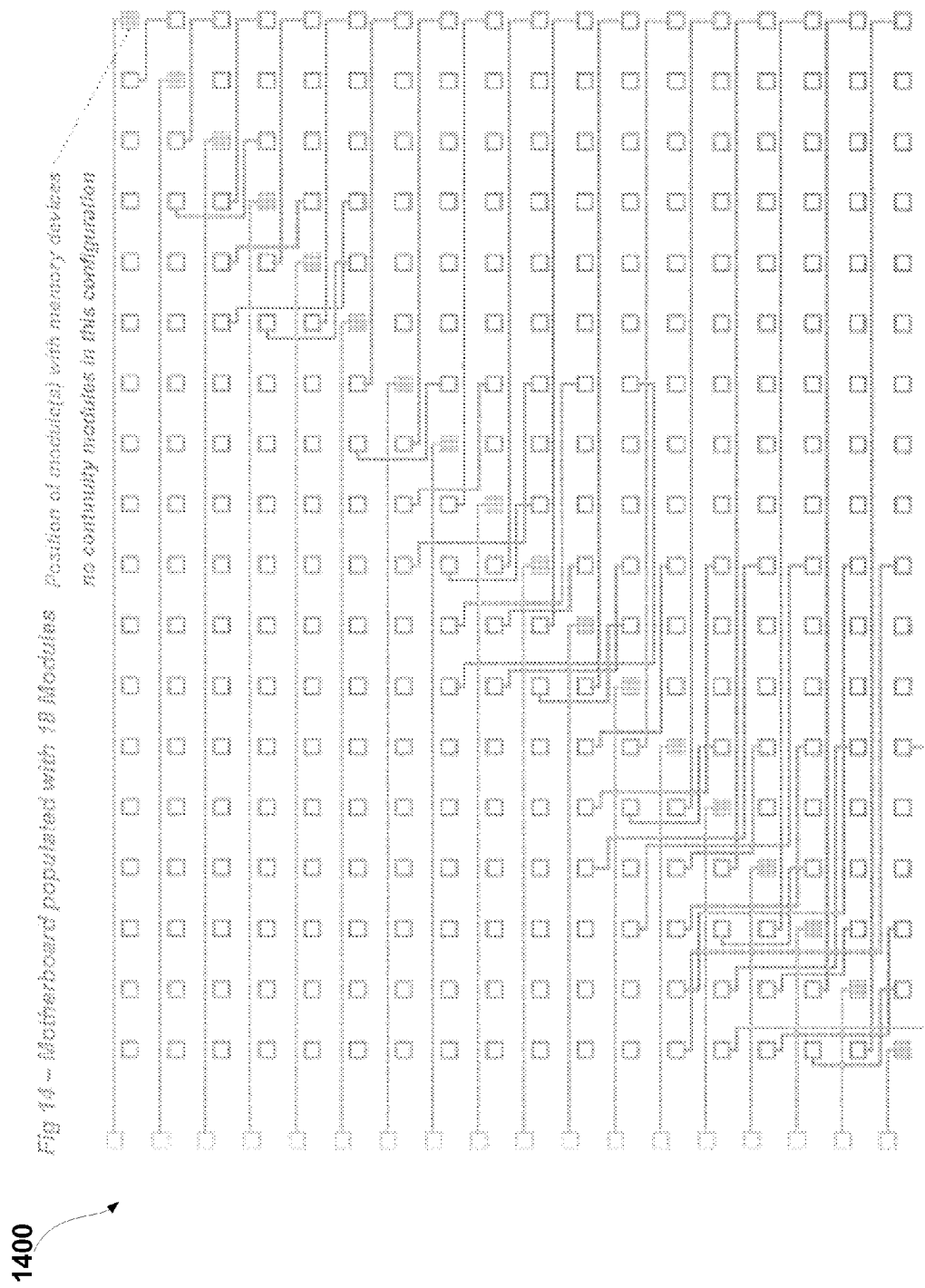

FIG. 15a Improved system with encoded primary CS, encoded secondary CS, decoded tertiary CS

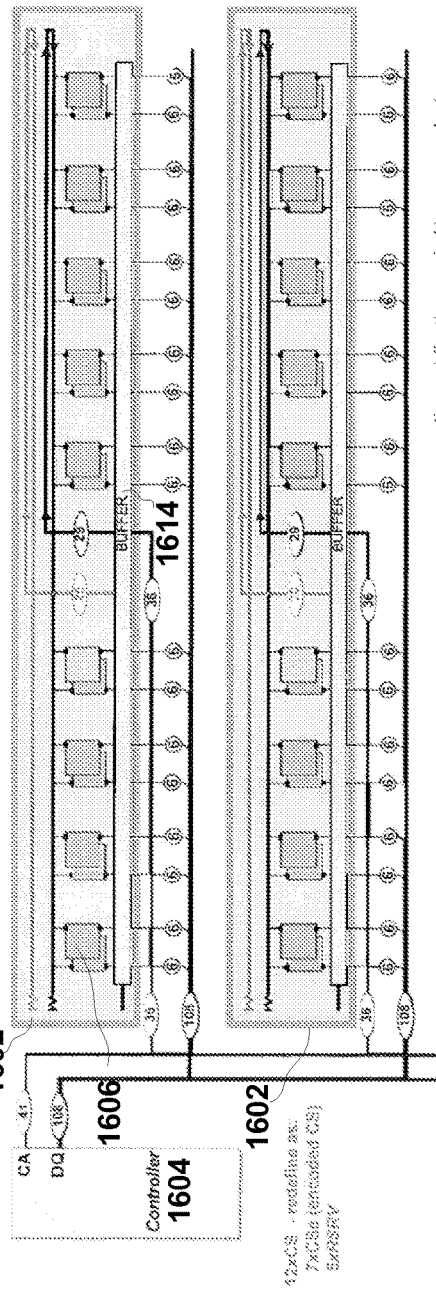
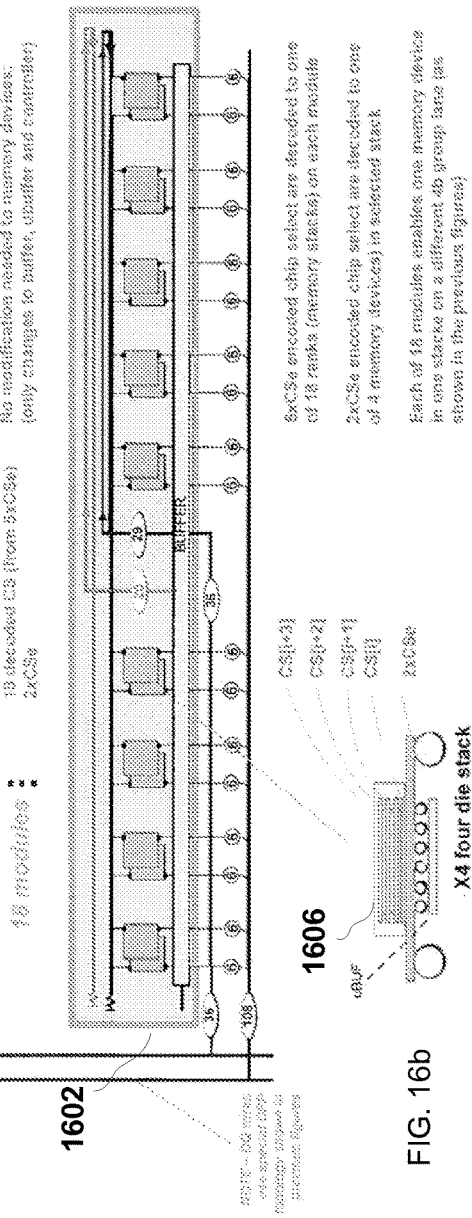
FIG. 16a Improved system with encoded primary CS, encoded secondary CS, decoded tertiary CS
FIG. 16b

HIGH CAPACITY MEMORY SYSTEM

RELATED APPLICATIONS

This application claims the benefit of U.S. Provisional Application No. 61/881,854, filed Sep. 24, 2013, the entire contents of which are incorporated by reference.

BACKGROUND

Computing memory systems are generally composed of one or more dynamic random access memory (DRAM) integrated circuits, referred to herein as DRAM devices, which are connected to one or more processors. Multiple DRAM devices may be arranged on a memory module, such as a dual in-line memory module (DIMM). A DIMM includes a series of DRAM devices mounted on a printed circuit board (PCB) and are typically designed for use in personal computers, workstations, servers, or the like. There are different types of memory modules, including a load-reduced DIMM (LRDIMM) for Double Data Rate Type three (DDR3), which have been used for large-capacity servers and high-performance computing platforms. Memory capacity may be limited by the loading of the data query (DQ) bus and the request query (RQ) bus associated with the user of many DRAM devices and DIMMs. LRDIMMs may increase memory capacity by using a memory buffer component (also referred to as a register). Registered memory modules have a register between the DRAM devices and the system's memory controller. For example, a fully buffer-componented DIMM architecture introduces an advanced memory buffer component (AMB) between the memory controller and the DRAM devices on the DIMM. The memory controller communicates with the AMB as if the AMB were a memory device, and the AMB communicates with the DRAM devices as if the AMB were a memory controller. The AMB can buffer component data, command and address signals. With this architecture, the memory controller does not write to the DRAM devices, rather the AMB writes to the DRAM devices Lithographic feature size has steadily reduced as each successive generation of DRAM has appeared in the marketplace. As a result, the device storage capacity of each generation has increased. Each generation has seen the signaling rate of interfaces increase, as well, as transistor performance has improved.

Unfortunately, one metric of memory system design which has not shown comparable improvement is the module capacity of a standard memory channel. This capacity has steadily eroded as the signaling rates have increased.

Part of the reason for this is the link topology used in standard memory systems. When more modules are added to the system, the signaling integrity is degraded, and the signaling rate must be reduced. Typical memory systems today are limited to just two or three modules when operating at the maximum signaling rate.

BRIEF DESCRIPTION OF THE DRAWINGS

The present disclosure is illustrated by way of example, and not by way of limitation, in the figures of the accompanying drawings.

FIG. 1a shows some details of the physical connection topology of the high speed signaling links in standard memory systems.

FIG. 1b shows some details of the physical connection topology of the command and address (CA) links of a standard memory system.

FIG. 1c shows some details of the physical connection topology of the data query (DQ) links of a standard memory system for a write access.

FIG. 1d shows some details of the physical connection topology of the DQ links of a standard memory system for a read access.

FIG. 1e shows some details of the physical connection topology of the high speed signaling links the improved memory systems according to one implementation.

FIG. 1f shows some details of the physical connection topology of the CA links of the improved memory system according to one implementation.

FIG. 1g shows some details of the physical connection topology of the DQ links of the improved memory system for a continuity module according to one implementation.

FIG. 1h shows some details of the physical connection topology of the DQ links of the improved memory system for memory module according to one implementation.

FIG. 2a shows a standard system with three modules according to one implementation.

FIG. 2b shows a standard memory system with two memory devices per device site according to one implementation.

FIG. 2c shows an improved memory system with six modules according to one implementation.

FIG. 2d shows an improved memory system with two memory devices per device site according to one implementation.

FIG. 3a shows the notation for a module with memory devices according to one implementation.

FIG. 3b shows the motherboard wiring pattern for each set of six DQ groups according to one implementation.

FIG. 3c shows the improved memory system with all six sockets filled with modules containing memory devices according to one implementation.

FIG. 3d shows the improved memory system with three sockets filled with modules containing memory devices according to one implementation.

FIG. 3e shows the improved memory system with two sockets filled with modules containing memory devices according to one implementation.

FIG. 3f shows the improved system with one socket filled with a module containing memory devices according to one implementation.

FIG. 4 shows a standard memory system populated with three modules.

FIG. 5 shows an improved memory system populated with six modules according to one implementation.

FIG. 6a shows the physical link topology of an eighteen-module system according to one implementation.

FIG. 6b shows the physical link topology of an eighteen module system with two CA buses according to one implementation.

FIG. 7a shows an improved memory system with eighteen modules according to one implementation.

FIG. 8 shows the motherboard wiring pattern for the eighteen DQ groups according to one implementation.

FIG. 9 shows the eighteen-module system with one socket filled with a module containing memory devices according to one implementation.

FIG. 10 shows the eighteen-module system with two sockets filled with modules containing memory devices according to one implementation.

FIG. 11 shows the improved system with three sockets filled with modules containing memory devices according to one implementation.

FIG. 12 shows the improved system with six sockets filled with modules containing memory devices according to one implementation.

FIG. 13 shows the eighteen-module system with nine sockets filled with modules containing memory devices according to one implementation.

FIG. 14 shows the eighteen-module system with all eighteen sockets filled with modules containing memory devices according to one implementation.

FIG. 15a shows a six-module system with six modules according to one implementation.

FIG. 16a shows an eighteen-module system with eighteen modules according to one implementation.

FIG. 16b shows a four die stack at a device site of the six-module system of FIG. 16a according to one implementation.

DETAILED DESCRIPTION

Figure 7B:
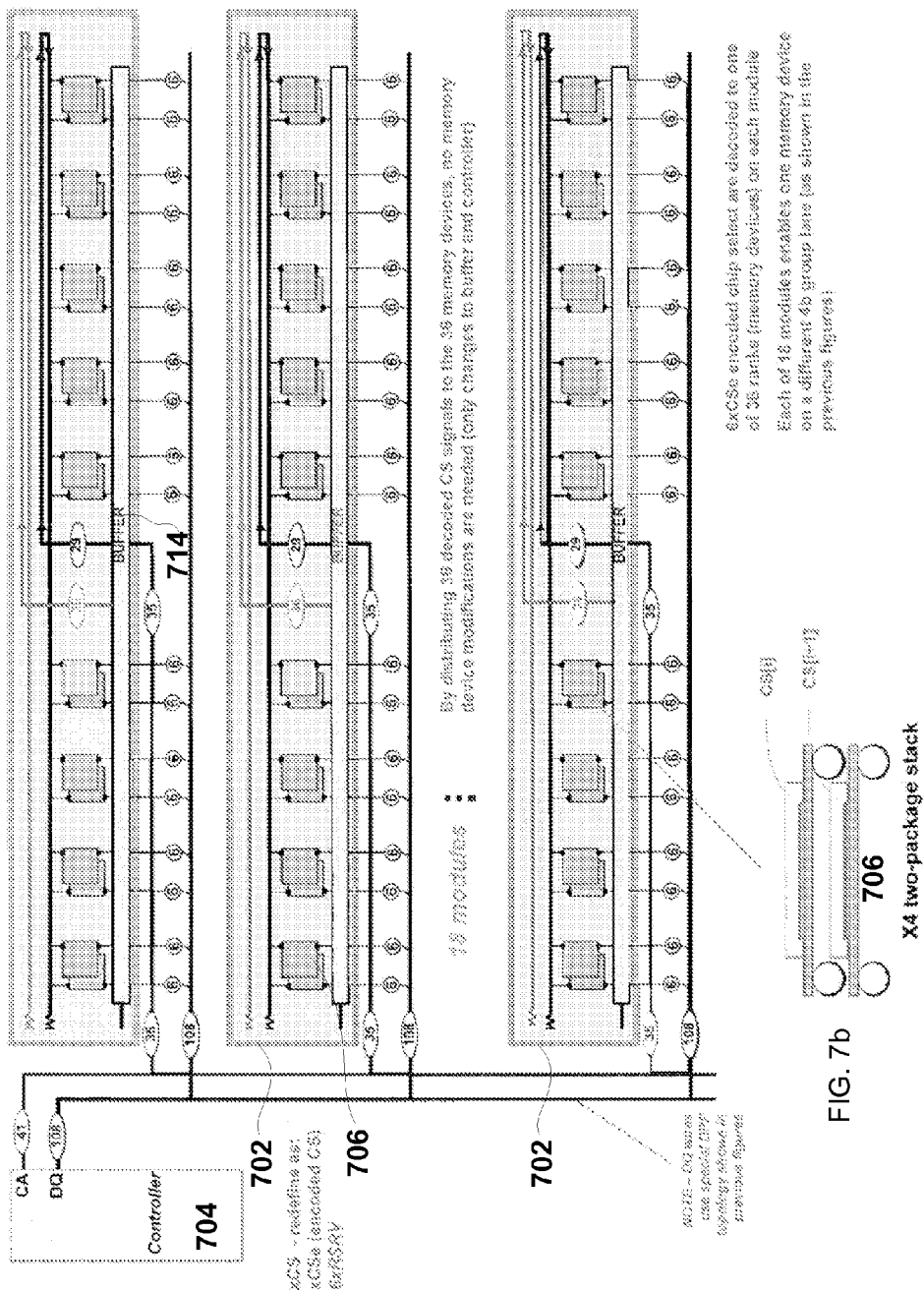
FIG. 7b shows a two die stack at a device site of the eighteen-module system of FIG. 7a according to one implementation.

The embodiments described herein describe technologies for memory systems. One implementation of a memory module includes a command and address (CA) buffer component, a data query (DQ) buffer component, and multiple device sites coupled to the DQ buffer component via data lines and coupled to the CA buffer component via chip select (CS) lines. A first number of the CS lines between the CA buffer component and any combination of two or more of the multiple device sites is greater than a second number of the CS lines between the CA buffer component and a single one of the multiple device sites. Another implementation of a memory module includes module connector pins, device sites; and a command and address (CA) buffer component. The CA buffer component receives encoded chip select information on a primary set of CS lines coupled between the module connector pins and the CA buffer component. The CA buffer component decodes the encoded chip select information received on the primary set of CS lines to obtain decoded CS information and sends the decoded CS information on a secondary set of CS lines coupled between the CA buffer component and the plurality of device sites. The decoded CS information selects one of multiple ranks, where a first number of the primary set of CS lines is less than a second number of the multiple ranks.

The embodiments described herein may be used for building memory systems with a significant increase in number of memory modules. The memory modules can also be inserted in the sockets of the memory system in different configurations. These new memory modules are built from standard memory components. A new memory controller components (with minimal modifications) and new memory modules may be used in standard memory systems or in new higher-capacity memory systems. The minimal modifications may be that the memory controllers are configured to send encoded CSe information as described herein.

In addition to improving the capacity, the embodiments described herein may be used to improve signaling integrity of the data-links, which normally limit the signaling rate. The embodiments may avoid some of the delays due to rank switching turnaround, another result of the standard link topology. The embodiments described herein may also be compatible with standard error detection and correction (EDC) codes. This includes standard (Hamming) ECC bit codes and standard "Chip-kill" symbol codes. In fact, in some configurations, the embodiments can correct for the complete failure of a module.

In one embodiment, a memory module includes multiple module connector pins; multiple memory components; a CA buffer component; a data query (DQ) buffer component; a first number of data lines coupled between respective ones of the multiple module connector pins and the DQ buffer component; a second number of data lines coupled between the DQ buffer component and the multiple memory components; a third number of primary chip select (CS) lines coupled between respective ones of the multiple module connector pins and the CA buffer component; and a fourth number of secondary CS lines coupled between the CA buffer component and the multiple memory components. The third number of primary CS lines is less than a fifth number of ranks of the memory module. In a further embodiment, each of the multiple memory components is at least one of a single memory device, a package stack of at least two memory devices, or a die stack of at least two memory devices. In another embodiment, the fourth number of secondary CS lines equals a total number of memory dies of the multiple memory components coupled to the DQ buffer component. In another embodiment, the fourth number of secondary CS lines equals one-third the total number of memory dies of the multiple memory components.

In some implementations, the CA buffer component receives encoded CS information on the third number of primary CS lines and decodes the encoded CS information to obtain decoded CS information to select one of the fifth number of ranks on the memory module. The CA buffer component sends the decoded CS information on the fourth number of secondary CS lines. In a further embodiment, the each rank includes at least three of the multiple memory components.

In other implementations, the CA buffer component receives encoded CS information on the third number of primary CS lines and decodes the encoded CS information to obtain a sub-rank selection of the multiple memory components. The CA buffer component sends a CS signal to the sub-rank selection of the multiple memory components. Selecting a rank on one module may be considered a sub-rank selection given that not all the data of an access may provided by the one module. In one module socket is populated, the memory module sends or receives all the data for a rank selection. However, when multiple module sockets are populated, the one memory module sends or receives a portion of the data and the other modules in the other module sockets send or receive the remaining portions of the data for the rank selection. When referring to the one module, it can be said that the rank selection is a sub-rank selection.

The memory module may further include a crossbar switch that maps the first number of data lines to the second number of data lines.

In another embodiment, a memory module includes a DQ buffer component, a CA buffer component, and multiple device sites. The device sites are coupled to the DQ buffer component via data lines and coupled to the CA buffer component via CS lines. In this embodiment, a first number of the CS lines between the CA buffer component and any combination of two or more of the device sites is greater than a second number of the CS lines between the CA buffer component and a single one of the device sites. In a further embodiment, each of the CS lines corresponds to a different rank of the memory module.

In one embodiment, the device sites may include a single memory component. In this implementation, the second number of CS lines is equal to one and the first number of CS lines is equal to a third number of the two or more of the device sites in the combination. So, for example, if there are three memory devices in the combination, the first number of CS lines is three.

In another embodiment, the device sites may include multiple memory device components. In this implementation, the second number of CS lines is equal to a third number of the memory components at the respective one of the device sites.

In another embodiment, the device sites include at least one of a single memory die, a package stack of at least two memory dies, or a die stack of at least two memory dies. In this implementation, the second number of CS lines is equal to a total number of memory dies at the respective one of the device sites. In another embodiment, a total number of CS lines of the memory module is equal to a total number of memory dies at the multiple device sites.

In another embodiment, a memory system includes a memory controller, a motherboard substrate with at least three memory module sockets. At least one of the at least three memory modules socket is populated with a memory module including multiple memory components and a command and address (CA) buffer component. The memory system further includes a first set of data lines coupled between the memory controller and the at least three memory module sockets; and a second set of primary chip select (CS) lines coupled between the memory controller and the at least three memory module sockets. The memory controller is to send encoded CS information on the second set of primary CS lines to select one of multiple ranks of the memory module. The CA buffer component is configured to decode the encoded CS information sent on the second set of primary CS lines to obtain decoded CS information with a sub-rank selection of the multiple memory components and send the secondary CS information to the sub-rank selection of the multiple memory components. The second set of primary CS lines is less than a number of the multiple ranks.

In another implementation, the memory system further includes a third set of secondary CS lines coupled between the CA buffer component and the multiple memory components. The third set of secondary CS lines is equal to the number of the multiple ranks. In one embodiment, the first set of data lines are point-to-point data lines, each point-to-point data line of the first set is coupled to only one of the at least three memory module sockets, and the second set of primary CS lines are multi-drop data lines, each multi-drop data line of the second set is coupled to all of the at least three memory module sockets. The memory module sockets may be dual in-line memory modules (DIMM) sockets.

In one embodiment, a first number of data lines in the first set of data lines equals a second number of the at least three memory module sockets associated with the memory controller. In another embodiment, each of the at least three memory module sockets is populated with either a memory module or a continuity module.

In another embodiment, a memory module includes multiple module connector pins; multiple device sites; and a CA buffer component. The CA buffer component is configured to: receive encoded chip select information on a primary set of CS lines coupled between the plurality module connector pins and the CA buffer component; decode the encoded chip select information received on the primary set of CS lines to obtain decoded CS information; and send the decoded CS information on a secondary set of CS lines coupled between the CA buffer component and the multiple device sites. The decoded CS information selects one of multiple ranks. In this embodiment, a first number of the primary set of CS lines is less than a second number of multiple ranks.

In a further embodiment, the memory module further includes a second set of multiple module connector pins; a DQ buffer component; a third set of data lines coupled between the second multiple module connector pins and the DQ buffer component; and a fourth set of data lines coupled between the DQ buffer component and the multiple device sites. The memory module may include a second DQ buffer component and a third DQ buffer component. Each of the multiple ranks includes at least three device sites. These device sites may contain at least one of a single memory device, a package stack of at least two memory devices, or a die stack of at least two memory devices.

In other embodiments, a memory module includes multiple module connector pins; multiple device sites; and a CA buffer component. The CA buffer component includes a primary CA interface connected to a memory channel and a secondary CA interface connected to the multiple device sites. The CA buffer is further configured to receive a first set of decoded, one-hot chip select control signals on the primary CA interface, pass the one-hot chip select signals to the secondary CA interface, and select one memory device at each of the multiple device sites to perform a first command specified on other lines of the CA interface in a first mode. In a second mode, the CA buffer component receives a second set of encoded, chip-select control signals on the primary CA interface, generates a third set of decoded chip-select control signals on the secondary CA interface, and selects one memory device in a subset of the multiple device sites to perform a second command specified on other lines of the CA interface.

In another embodiment, the memory module further includes multiple data-link buffer devices. The memory module is configured to operate in a first mode of operation or a second mode of operation. In the first mode of operation, the memory module is inserted onto a first type of memory channel with multi-drop data links shared with at least one other memory module. In the second mode of operation, the memory module is inserted onto a second type of memory channel with point-to-point data links that do not share with the at least one other memory module.

In a further embodiment, the memory module further includes a primary data interface configured to connect to the memory channel. The primary data interface is divided into a first number (N) of groups of a second number (G) of data-links plurality (N), each of the N groups with a data timing link, where each N*G data-link primary interface is contained within one of the multiple data-link buffer devices. Each of the multiple data-link buffer devices contains a second interface connecting N*G secondary data-links, which connect to N device sites of the multiple device sites, with each one of multiple secondary data-link groups connecting to one device site of the multiple device sites.

The DQ buffer component is configured to connect each one of the N primary data-link groups to each one of the N secondary data-link groups, in a fixed mapping that is the same for all memory accesses during in the first mode. The DQ buffer component is further configured to connect one of the N primary data-link groups to one of the N secondary data-link groups during a first memory access in the second mode and to connect the primary data-link group to a different one of the N secondary data-link groups during a second memory access in the second mode. In one embodiment, the DQ buffer component includes a symmetric N*N cross-bar switch in the second mode, where the symmetric N*N cross-bar switch is configured to connect any one of the N primary data-link groups to any one of the N secondary data-link groups. The memory channel includes a number of M*N*G of data links, where M is a number of the multiple data-link buffer devices.

In a further embodiment, a CA buffer component includes rank mapping logic as described below as in the Improved System—rank mapping section. The CA buffer component further includes a first set of receivers coupled to the rank mapping logic. The first set of receivers is configured to receive encoded chip select (CS) signals from a memory controller over multiple primary CS links. The CA buffer component also includes a second set of transmitters configured to send decoded CS signals to multiple memory components of a memory module over multiple secondary CS links to select one of multiple ranks of the memory module. The rank mapping logic is configured to receive the encoded CS signals and to decode the encoded CS signals to obtain the decoded CS signals to send over the multiple secondary CS links. In this embodiment, a first number of the multiple primary CS links is less than a second number of the multiple ranks. In a further embodiment, each of the multiple ranks includes at least three of the multiple memory components. In another embodiment, the CA buffer component includes multiple primary CA links that are multi-drop links that connect with all other memory modules connected to a memory controller to which the memory module is connected. The CA buffer component is to receive encoded primary chip select (CSe) information from the memory controller over the multiple primary CS links of the multiple primary CA links. The CA buffer component further includes multiple secondary CS links that are connected to the multiple device sites. The CA buffer component is to decode the encoded primary CSe information and send decoded CSd information over the multiple secondary CS links of the multiple secondary CS links.

In another embodiment, a motherboard substrate includes at least three memory module sockets. At least one of the at least three memory modules socket is populated with a memory module. The memory module includes multiple device sites coupled to a DQ buffer component via data lines and coupled to a CA buffer component via CS lines. As described above, a first number of the CS lines between the CA buffer component and any combination of two or more of device sites is greater than a second number of the CS lines between the CA buffer component and a single one of the device sites.

The following is a description of link topology in standard memory systems.

Link Topology in Standard Memory Systems

FIG. 1a shows some details of the physical connection topology 100 of the high speed signaling links in current memory systems. There are two classes of links: the CA (control-address) links 101 and the DQ (data) links 102.

These signals are transmitted (and received, in the case of DQ links) by the controller component 103 (also referred to herein as a memory controller but can be other components that control access to the memory modules). These signals are typically received (and transmitted, in the case of DQ links) by buffer components on a module 106, such as a CA buffer component 104 and DQ buffer component 105.

Some systems may not use buffer components in the path of the CA and DQ links on the memory module 106, but these memory systems may tend to have a more limited memory device capacity and a more limited signaling rate. This is because the un-buffer-componented links can be impacted by the longer wires and heavier loading on the module.

The CA and DQ links may be buffer-componented by the same component, or there may be a separate CA buffer component and a separate DQ buffer component (also referred to herein as DQ-BUF component). Examples of both of these alternatives will be described.

First DQ buffer component may be divided (sliced) into several smaller components, each covering a subset of the DQ links. DQ buffer components, which handle 24 DQ links and 72 DQ links are described in Other DQ buffer widths are possible (36 DQ links is another alternative). A wider DQ buffer may permit a larger module capacity for the present disclosure.

Some embodiments of the present disclosure are primarily focused on those systems in which maximum memory device capacity is important. It should be noted that the technologies described in this disclosure can also be applied to systems with moderate capacity, as well.

The embodiments discussed in this disclosure all assume memory modules with seventy-two data links (72 DQ links) to accommodate standard EDC codes. The technologies described in this disclosure can be applied to memory modules with other number of data links as well, such as sixty-four DQ links.

CA Link of Standard CA Links in Multi-Drop Topology

In FIG. 1a, it should be noted that even with the assumption of CA and DQ buffer-componenting, there may still be issues of signaling integrity, particularly with the DQ links.

The CA link topology typically includes a transmitter on the controller, a controlled-impedance wire on a motherboard substrate, and a termination resistor at the farthest end. A receiver in the CA buffer component in each module connects to the CA link, adding multiple loads to the link. In some implementations, each CA buffer component has on-die termination resistors. This is called a multi-drop topology.

This module load is primarily capacitive, and includes loading introduced by a socket connection to a module pin, the wire trace between the module pin and the buffer component, and the receiver circuit on the buffer component.

The receiver circuit includes the transistors forming the input amplifier, as well as the protection devices that guard against electrostatic discharge. This protection device includes some series resistance as well.

Because the CA link is input only, the total capacitive load is relatively small. FIG. 1b shows a lumped capacitance $C_{CA}$ 107 representing this load. The impact of CA loading (and methods to address it) will be covered in a later section.

DQ Link of Standard DQ Link in Multi-Drop Topology

The DQ link topology typically includes a transmitter and receiver on the controller and a controlled-impedance wire on a motherboard substrate.

Inside the first DQ buffer component there is a termination device, a receiver, and a transmitter. Each module (with a DQ buffer component) adds a load to the DQ link.

The loading presented by each buffer component is mainly capacitive, and includes loading introduced by the socket connection to the module pin, the wire trace between the module pin and the buffer component, and the transmitter and receiver circuits on the buffer component.

The receiver/transmitter circuit includes the transistors forming the input amplifier and the output driver, as well as the protection devices that guard against electrostatic discharge. This protection device and the output driver include some series resistance as well.

Because the DQ link is input/output (bidirectional), the total capacitive load $C_{DQ}$ will be larger than the $C_{CA}$ that is present on the CA links FIGS. 1c and 1d show a lumped capacitance $C_{DQ}$ 108 representing this load.

The impact of DQ loading (and methods to address it) will be covered in a later section.

A fundamental signaling problem arises because of the fact that the DQ links are bidirectional in that read data can be driven from any module position. FIG. 1d illustrates a read access on the DQ link. The transmitter in the first DQ buffer component drives the signal through the module trace and the connector to the motherboard trace. Here the signal's energy is divided, with half going left and half going right.

Ideally, the half signal traveling to the end of the module is absorbed by the terminator on the last module, which has been turned on. In practice, the signal divides at the inactive modules and reflects back, introducing ISI (inter-symbol-interference) and degrading signal integrity. In some systems, the termination devices are partially enabled in the inactive modules.

FIG. 1c illustrates the analogous problem for write data. The transmitter in the controller drives the signal through the motherboard trace. The signal's energy is divided at each module. If the module has disabled termination, the signal reflects back out to the motherboard, with half going left and half going right.

This is addressed in the standard system by including termination devices at each module, typically as an adjustable device in the input/output circuit in the DQ buffer component.

A consequence of this need to choreograph the termination values may introduce idle cycles (bubbles) between accesses to different modules.

The termination value of this device is adjusted according to which module accesses the data. It is possible that the termination value used in the non-selected modules is adjusted as well, for optimal signaling.

This is not a scalable signaling topology, as evidenced by the limited module capacity of standard systems.

The embodiments described herein are directed to an improved signaling topology for the DQ links of a memory system. This improved topology provides higher module capacity, and can be implemented in such a way that key components (controllers, modules, buffer component devices) can be designed so they can be used in either standard systems or in improved systems.

Improved Link Topology

The embodiments disclosed in this disclosure can be employed to gain a number of important benefits:

[1] The system capacity can be improved from the two-module standard systems or three-module standard systems: a capacity of eighteen modules is possible.

[2] The capacity of the system is adjustable; an eighteen module system can hold different combinations of {1,2,3,6,9,18} modules.

[3] The signaling integrity of the DQ links is improved significantly from the multi-drop topology of standard systems: each DQ link uses a point-to-point topology.

[4] High capacity systems allow standard error detection and correction codes (i.e. ECC, Chip-kill); in addition, in some configurations it is possible to correct for the complete failure of a module.

These improvements may be achieved while maintaining a high degree of compatibility to standard memory systems and their components:

[1] No change to the memory component.

[2] Modest changes to the controller component; the new controller can be used in standard systems as well as high capacity systems.

[3] Change to the module—specifically a new buffer component design; the new module can be used in standard systems as well as high capacity systems.

By offering a standard mode and an improved mode of operation, the manufacturer of the controller component and the buffer component can deliver the same product into both standard motherboards and improved, high capacity motherboards.

In FIG. 1e, the physical signaling topology 110 of the CA line 111 and DQ links 112 are shown for the improved system. A six-module improved system is assumed in this section. An 18-module improved system will be described in a later section.

CA Link of Improved Memory System

The CA link topology 110 is similar to the CA topology 100 of the standard system. FIGS. 1e and 1f illustrate these similarities. The principle difference is that there is a larger number of modules 116, resulting in more loads along the controlled-impedance wire.

The CA link topology 110 includes a transmitter on the controller, a controlled-impedance wire on a motherboard substrate, and a termination resistor at the farthest end. A receiver in a CA buffer 114 in each module 116 connects to the CA link 111, adding multiple loads to the link 111. This is called a multi-drop topology.

This module load is primarily capacitive, and includes loading introduced by the socket connection to the module pin, the wire trace between the module pin and the buffer component, and the receiver circuit on the CA buffer 114.

The receiver circuit includes the transistors forming the input amplifier as well as the protection devices which guard against electrostatic discharge. This protection device includes some series resistance, as well.

Because the CA link 111 is input only, the total capacitive load is relatively small—FIG. 1e shows a lumped capacitance $C_{CA}$ 117 representing this load.

The round trip propagation time from the motherboard connection to the CA buffer 114 is typically short compared to the rise and fall times of the signal, so the parasitic elements may be lumped together.

If this round trip propagation time is relatively long (i.e. the CA buffer 114 is further from the module connector pins), the parasitic elements are treated as a distributed structure, potentially creating reflections and adding to inter-symbol-interference (ISI) in a more complex way.

One effect of the loading on the CA link 111 will be to reduce the propagation speed of on the motherboard links. This may cause a slight increase in command latency, but can be automatically compensated for since the CA links 111 include a timing signal CK which sees the same delay.

A second effect of the loading will be to reduce the characteristic impedance of the motherboard trace in the module section. FIG. 1*f* shows this. The impedance change between the loaded and unloaded sections of the motherboard links can also create reflections and add to ISI.

It is possible to adjust the trace width of the motherboard links, widening them in the unloaded sections and narrowing them in the loaded sections to reduce the impedance mismatch.

This can also be done to the trace widths on the module, to compensate for impedance variations through the socket structure that connects a module pin to a motherboard trace. This can be important because the socket structure changes the geometry and spacing of the two-wire conductor carrying the signal. This change can be seen in FIG. 1*f* when the two conductors are routed vertically from the motherboard to the module.

Another way to deal with the ISI is to use decision-feedback-equalization (DFE) or similar techniques. This approach uses the past symbol-values that were transmitted on a link, and computes an approximation for the reflection noise they have created. This approximation can be subtracted from the signal (at the transmitter or receiver) to get a better value for the current symbol being transferred.

A third effect of the CA loading will be to cause attenuation of the signal at higher frequencies. This attenuation is caused, in part, by the parasitic series resistance in the input protection structure of the CA buffer. The attenuation may become more pronounced for the higher frequency spectral components of the signal.

This attenuation may be greater than in the standard system. It should be noted that the attenuation per unit length will be about the same in both systems, but the CA wire is longer in the improved system to accommodate the additional modules, hence the increase.

This can be addressed by reducing the signaling rate of the CA link 111. The CA links 111 are already have lower bit transfer rates than the DQ links 112; a CA link 111 transfers one bit per clock cycle, whereas the DQ links 112 transfer two bits per clock cycle (twice the signaling rate).

The CA rate can be lowered further so that one bit is transferred every two clock cycles (this is called 2T signaling, as compared to the normal 1T signaling). This lower CA rate will typically be adequate to provide the command bandwidth needed.

Another option is to add transmit equalization to the controller, or receive equalization to the buffer. This causes the higher frequency components of the signal to be selectively amplified, to compensate for the attenuation (which affects the high-frequency components the most).

DQ Link of Improved Memory System

The DQ link topology is very different from the standard system. FIG. 1*e* illustrates this difference in DQ link topologies 110.

The DQ link topology includes a transmitter and receiver on the controller and a controlled-impedance wire on a motherboard substrate 120, as before. Inside the DQ buffer component 115 of a module 116 there is a termination device, a receiver, and a transmitter, as in the standard DQ link topology. There are several key differences in the way these are connected together, such as set forth below:

[1] The DQ link 112 connects to a single module 116 in a point-to-point topology. This gives the best possible signaling quality, since the receiver and transmitter are at opposite ends of a controlled-impedance transmission line, with a termination device enabled at the receiver end of the link. Optionally, a termination device can be enabled at the transmitter end to dampen reflection noise further. This may cut the voltage swing of the signal in half, so this might not be a good tradeoff.

[2] The link includes a segment (the "x" segment) of wire on the motherboard 120, a connection through a continuity module 119 (the "z" segment), and a second segment of wire on the motherboard (the "y" segment) 120. Some DQ links 112 may only go through a single segment of wire on the motherboard (no connection through a continuity module 119). FIGS. 1*g* and 1*h* illustrate this topology. FIG. 1*g* shows some details of the physical connection topology of the DQ links of the improved memory system for a continuity module 119 according to one implementation.

The continuity module 119 is a standard module substrate with no active devices. It plugs into a standard socket, and connects some of the DQ links 112 to other DQ links 112 with a controlled impedance wire.

This connection through a continuity module may introduce some discontinuities to the link, mainly by the socket connection to the continuity module connector pins. This is because the geometry and spacing of the two-conductor transmission line changes at these socket connections.

Each DQ link 112 sees an impedance change at the meeting point of the "x" and "z" segments, and an impedance change at the meeting point of the "z" and "y" segments. These impedance changes can create reflections and add to ISI.

It is possible to compensate partially for these impedance changes by adjusting the trace widths if the DQ link 112 on the module (memory module 116 or continuity module 119).

Another way to deal with the ISI is to use decision-feedback-equalization (DFE) or similar techniques. This approach uses the past symbol-values that were transmitted on a link, and computes an approximation for the reflection noise they have created. This approximation can be subtracted from the signal (at the transmitter or receiver) to get a better value for the current symbol being transferred.

Because of this simpler DQ link topology, the improved system may have better DQ signal quality (even with the continuity module 119). The improved system may also avoid the need to introduce idle cycles (bubbles) between accesses to different modules.

Memory Systems Details of a Standard Memory System

FIG. 2*a* shows a standard memory system 200 with three memory modules 202.

The controller component 204 is shown in the upper left of FIG. 2A. It connects to one hundred and eight (108) DQ links and forty-one (41) CA links in the depicted embodiment.

The 108 DQ links includes 72 DQ data-links and 36 DQS timing links. This link count includes the extra links needed for standard error detection and correction codes. This includes standard (Hamming) ECC bit codes and standard "Chip-kill" symbol codes.

An improved controller component has been designed to operate with standard modules or with improved modules. A control register, or control pin, or some equivalent method selects the mode in the controller 204 for the motherboard and module environment in which it is used. A similar mode control method is used in the buffer devices on the improved module.

The forty-one (41) CA links include twelve (12) CS (chip-select) links for standard operation. This allows four ranks of memory devices on each of three standard modules. Each of the three groups of four CS links is routed with a point-to-point topology to the appropriate module. The remaining CA links (with command, control and address)

are connected to the three modules via motherboard wires in a multi-drop topology as previously discussed. For each command issued on the CA links, one of the 12 CS links will be asserted, indicating which of the 12 ranks is to respond. Four of the twelve CS links and the twenty-nine other CA links are may be received by the CA buffer component (CA-BUF) 214 on each module 202 and each module 202 receives a different set of four CS links. However, the system 200 in FIG. 2a only includes two ranks per module (there are two devices per device site), so only 6 of the 12 chip-select links will be used in this case, two chip-selects per module.

The 12 CS links and 29 additional CA links (with command, control and address) are connected to the 3 modules 202 via motherboard wires in a multi-drop topology as previously discussed.

The term "primary" refers to a link that connects the buffer component on the module 202 to the memory controller 204 via the motherboard. The term "secondary" refers to a link that connects the buffer component device 214 on the module 202 to memory devices (e.g., DRAM devices) at the device sites 206.

The twenty-nine (29) CA links and the four (4) CS links are retransmitted in a secondary multi-drop topology to the eighteen (18) device sites 206 on the memory module 202. A device site 206 can include one or more 4-bit memory devices. This example has two devices (see FIG. 2b) stacked at each site. Alternative devices can be disposed at the device sites as described herein.

The 4 CS links are retransmitted as 4 CS links in the secondary multi-drop topology to the eighteen (18) device sites 206 on the module 202.

In each access, each DQ buffer component 215 accesses 6 of the 12 devices attached to its secondary DQ links. The selected devices couple to the six primary DQ links to which the DQ buffer component 215 connects.

The primary DQ links use a multi-drop topology, as discussed previously with respect to FIGS. 1a, 1c, and 1d.

System Details of Improved Memory System

FIG. 2c shows an improved memory system 250 with six modules 252. A subsequent section will discuss an improved system with eight (18) modules.

The memory controller component 254 is shown in the upper left of FIG. 2C. The memory controller component 254 connects to 108 DQ links and 41 CA links. This is equal to the link count for a typical three-module standard system. As described herein, the improved memory system 250 may include three modules 252 or more than three modules 252. Alternatively, as described herein, the improved memory system 250 may include any number of modules, including memory systems with any of the following numbers of modules: 1, 2, 3, or 6.

The 108 DQ links includes 72 DQ data-links and 36 DQS timing links. This link count includes the extra links needed for standard error detection and correction codes. This includes standard (Hamming) ECC bit codes and standard "Chip-kill" symbol codes.

The memory controller component 254 has been designed to operate with standard modules (e.g., 202) or with improved modules 252. A control register, or control pin, or some equivalent method selects the memory controller component 254 for the motherboard and module environment in which it is used. A similar mode control method may be used in the buffer devices on the improved module 252.

The memory controller component 254 and the improved modules 252 could be used in a standard motherboard, like the one in FIG. 2a. The memory controller component 254 and the improved modules 252 could also be used in the improved motherboard in FIG. 2c.

The memory controller component 254 and the buffers (command and address (CA) buffer component 253, DQ buffer components 255) on the improved modules 252 would be adjusted with a field in a control register, or with a control pin, or some equivalent method. This would adjust them to use the chip-select links in the appropriate fashion. It would also instruct the data-link buffers 255 on how to transfer data between the primary data-links and the secondary data-links.

The ability to use the memory controller component 254 and the improved modules 252 in either the legacy systems with standard capacities or in improved systems with high capacity may reduce the barrier to entry in the marketplace.

The 41 CA links include 12 CS (chip-select) links for standard operation (this allows four ranks of memory devices (also referred to herein as "memory components") on each of three standard modules 202). For each command issued on the CA links, one of the 12 CS links will be asserted, indicating which of the 12 ranks is to respond.

In an improved system, these 12 CS links are re-tasked by a control method. Four of the links are redefined as encoded chip-selects (CSe) links, and the remaining eight links are reserved (for additional chip-selects when more addressing capacity is needed).

The 4 CSe links and 29 additional CA links (with command, control and address) are connected to the six modules 252 via motherboard wires in a multi-drop topology as previously discussed.

The routing of the 12 CSe links may be different in the standard motherboard and the improved motherboard. The routing of the data links may be different, as well, so the two motherboard designs may be separate products in the manufacturer's inventory.

These 33 links are received by the CA buffer (CA-BUF) component 253 on each module 252. It is possible that some of the eight reserved CS links may be routed to unused module connector pins on the module, to allow for future capacity expansion.

Alternatively, the ODT (output-device-termination) control signals could be re-tasked for the additional encoded chip-select links for the module. The improved system 250 may not need fine control of the termination devices; a point-to-point DQ topology can enable the termination devices according to the column access command (read or write).

The 29 CA links are retransmitted in a secondary multi-drop topology to the 18 device sites 256 on the module 252. A device site 256 may include of one or more 4-bit memory devices. This example has two memory devices stacked at each site as shown in FIG. 2d.

A device site 256 could, alternatively, be defined with 8-bit memory devices, but this could limit the device capacity of the module.

The 4 CSe links are decoded by the CA buffer component 253 and retransmitted as 12 CSd links in the secondary multi-drop topology to the 18 device sites 256 on the module 252.

The 18 device sites are broken into three sets of 6-device sites. Each of these 6-device sites connects to a respective DQ buffer component (DQ-BUF) 255 via the secondary DQ links. A 6-device site is outlined at 258 on the left side of the lowest module 252. The six device sites of one of the three sets are coupled to the respective DQ buffer component 255 via data lines and are coupled to the CA buffer component 253 via CS lines. A first number of CS lines between the CA buffer component and any combination of two or more of the six device sites is greater than a second number of the CS lines between the CA buffer component and a single one of the six device site. For example, when two memory devices are located at each of the six device sites, there are 12 CS lines coupled between the CA buffer component 253 and the 6 device sites, 2 CS lines per device site (12 memory devices in total). There are two CS lines that go to a single device site, whereas more than two CS lines go to the combination of two or more device sites, as illustrated in FIG. 2c. For another example, when a single memory device is located at each of the six device sites, there are 6 CS lines coupled between the CA buffer component and the 6 memory lines coupled between the CA buffer component and the 6 device sites, 1 CS lines per device site (6 memory devices in total). There is one CS lines that go to a single device site, whereas more than one CS lines go to the combination of two or more device sites, as illustrated in FIG. 5.

In one embodiment, each of the CS lines between the CA buffer component and the 6-device site (e.g., 6-device site 258) corresponds to a different rank of the memory module 252. The memory module 252 may include three 6-device sites as described herein. As described herein, each of the device sites may include a single memory component or multiple memory components. In the case of single memory components at device sites, the second number of CS lines is equal to one and the first number of CS lines is equal to a third number of device sites in the combination. In the case of two memory components at device sites, the second number of CS lines is equal to two and the first number of CS lines is greater than two since each device site has two CS lines.

In another embodiment, the device sites include at least one of a single memory die, a package stack of at least two memory dies, or a die stack of at least two memory dies. In some cases the second number of CS lines is equal to a total number of memory dies at the respective device site. In other embodiments, a total number of CS lines of the memory module 252 is equal to a total number of memory dies at the device sites on the memory module 252.

There are three indexes used to describe the connection hierarchy of the data-links.

A group of G data-links includes a timing reference link. In the embodiment in FIG. 2b a group is 4 DQ links plus the differential DQS timing link (G=4).

Each DQ buffer component 255 connects to N groups of data-links. In the embodiment of FIG. 2c, each DQ buffer component 255 buffer connects to six groups (N=6).

Each module 252 contains M data-link buffers. In the embodiment of FIG. 2c, there are three data-link buffers (M=3).

The module connects to M*N*G data-links altogether (72 DQ links in the embodiment of FIG. 2c). In most configurations, the data-link buffers only transfer data across a subset of the data-links during an access; only in the case of a single module system does that module transfer data across all 72 of its DQ links.

The 12 CSd links in the secondary CA bus connect to one memory device each in each of the 6-device sites, where there are two memory devices per device site 256 as shown in FIG. 2d. For example, in the 6-device site 258, the two memory devices of a first device site 256(1) may be connected to first and second CSd links (e.g., CSd0 and CSd1), the two memory devices of a second device site 256(2) may be connected to third and fourth CSd links (e.g., CSd2 and CSd3), the two memory devices of a third device site 256(3) may be connected to fifth and sixth CSd links (e.g., CSd4 and CSd5), the two memory devices of a fourth device site 256(4) may be connected to seventh and eighth CSd links (e.g., CSd6 and CSd7), the two memory devices of a fifth device site 256(5) may be connected to ninth and tenth CSd links (e.g., CSd8 and CSd9), and the two memory devices of a sixth device site 256(6) may be connected to eleventh and twelfth CSd links (e.g., CSd10 and CSd11). Thus, the number of CSd links connected between CA buffer component 253 and any combination of two or more device sites 256(1)-256(6) is greater than the number of CSd links connected between CA buffer component 253 and a single one of device sites 256(1)-256(6).

In each access, each DQ buffer component 255 accesses one of the 12 devices attached to its secondary DQ links, and couples it to one of the six primary DQ links to which it connects.

In one embodiment, the DQ buffer component 255 includes a 6×6×4b crossbar switch 260 to accomplish this switching. A full crossbar switch 260 is necessary so that a module 252 may occupy any socket position in a system of any allowable capacity.

This means that a four-DQ group (including two DQS links) can be steered from any of the six secondary groups (connecting to the memory devices) to any of the six primary groups (connecting to the controller component).

This steering may be done with a single group, or with two adjacent groups, or with three adjacent groups, or with all six groups. In the next section, FIGS. 3c, 3d, 3e, and 3f show these cases.

The crossbar switch 260 in the lower left of FIG. 2c is only showing the steering options of one primary group to the six secondary groups for clarity; the steering logic for the other five primary groups would be similar.

It should be noted that in FIG. 2c, the DQ links are shown with a multi-drop topology. These links employ a special DPP topology (dynamic point-to-point), and will be described in the next several figures.

It should be noted that by distributing 12 decoded CS signals to the 36 memory devices on each module, no memory device modifications are needed (only changes to the memory controller component 254 to send encoded CS signals and to the CA buffer component 253 to decode the encoded CS signals). The 4×CSe encoded chip select are decoded to one of 12 ranks (3 memory devices) on each module. Each of the six modules enables one memory device on a different 4b group lane (as shown in FIG. 2a).

As illustrated and described herein, there may be a first number of primary CS lines coupled between respective ones of the module connector pins and the CA buffer component 253 and a second number of secondary CS lines coupled between the CA buffer component 253 and the memory components. This first number of primary CS lines is less than a third number of ranks of the memory components at the device sites 256. The second number of secondary CS lines may be equal to the number of ranks. For example, as illustrated in FIG. 2c, there are 18 device sites 256 that are split into three sets of 6-device sites, resulting in 12 ranks with three device sites 256 per module 252 per rank. The encoded CS information can be received by each of the CA buffer components 253 on each of the modules 252 over the four primary CS lines. The CA buffer components 253 decode the encoded CS information to obtain the decoded CS information, selecting one of the twelve ranks using the twelve secondary CS lines on each of the modules 252. In another embodiment, the second number of secondary CS lines is greater than the first number of primary CS lines as illustrated in FIG. 2a. An individual CA buffer component 253 may receive encoded chip select information on the primary CS lines coupled between the module connector pins and the CA buffer component 253. The CA buffer component 253 decodes the encoded chip select information received on the primary CS lines to obtain decoded CS information and sends the decoded CS information on the secondary CS lines coupled between the CA buffer component 253 and the memory components at the device sites 256. The decoded CS information selects one of multiple ranks, where the first number of the primary CS lines is less than a number of the multiple ranks and the second number of the secondary CS lines is equal to the number of the multiple ranks.

Motherboard Wiring for Improved Memory System

FIG. 3a shows the notation for a module 302 with device sites 306. The blocks 310 indicate the connection(s) being made on the primary side. The connections on the secondary side are made with a symmetric crossbar switch in the DQ buffer device 320. That detail is not shown in the next five figures which illustrate the capacity options of the six module system.

FIG. 3b shows the motherboard wiring pattern for each set of six DQ groups 330. Each group wire 330 includes 4 DQ data-links and 2 DQS timing links. The wiring pattern is repeated three times in each memory system for each of the three DQ buffers per module (the M parameter is 3 in this embodiment).

In FIG. 3b, lines 331 represent the "x" segment of motherboard wire for a group, and lines 332 represent the "y" segment of motherboard wire for a group. The squares 334 represent the sockets for each group of a module 302. A continuity module 319 is needed to connect an "x" motherboard wire segment 331 to a "y" motherboard wire segment 332 (with a "z" segment 333 on the continuity module). In some configurations, the "x" motherboard wire segment 331 makes the desired connection directly.

FIG. 3c shows the improved system with all six sockets filled with modules containing memory devices 302. In this case, each module connects directly to a group wire 311, indicating that each module 302 can communicate with the controller 354 via a single "x" wire segment 331 on the motherboard. It should be noted that each DQ buffer 32 may need to steer data from a different primary DQ group position to the desired device site 306 (and desired memory component). This figure should make it clear why the full 6×6×4b crossbar switch is required in each DQ buffer 320.

FIG. 3d shows the improved system with three sockets filled with modules 302 containing memory devices. The other three sockets contain continuity modules 319. This system example requires a set of three continuity module designs {C0,C1,C3}, each with a different group wiring pattern.

The continuity modules 319 occupy alternate socket sites. The CA links don't connect to the continuity sockets, so the CA loading may be reduced in these partial-capacity systems. If equalization is being used for the CA links, it can be adjusted for the capacity option.

In this case, each module 302 connects directly to one group wire 310 and to one group wire 340. The three continuity modules 319 connect the remaining three group wires 310 to these three group wires 340. Each module 302 connects to the controller 354 on two group wires 330 (this pattern may be repeated three times in each module, once for each DQ buffer).

It should be noted that the motherboard wiring pattern and the wiring pattern on the continuity modules 319 shown are exemplary; other sets of patterns are possible.

FIG. 3e shows the improved system 370 with two sockets filled with modules 302 containing memory devices. The other four sockets contain continuity modules 319. This system 370 requires a set of four continuity module designs {C0,C1,C2,C3}, each with a different group wiring pattern.

The continuity modules occupy two-thirds (⅔) of the socket sites in a repeating pattern. The CA links don't connect to the continuity sockets, so the CA loading may be reduced in these partial-capacity systems. If equalization is being used for the CA links, it can be adjusted for the capacity option.

In this case, each module connects directly to one group wire 330 and to two group wires 340. The four continuity modules 319 connect the remaining four group wires 330 to these four group wires 340. Each module 302 connects to the controller 354 on three group wires (this pattern may be repeated three times in each module, once for each DQ buffer).

FIG. 3f shows the improved system 380 with one socket filled with a module 302 containing memory devices. The other five sockets contain continuity modules 319. This system 380 requires a set of five continuity module designs {2×C2,3×C3}, with two different group wiring patterns. It should be noted that identical continuity modules are used in some of the sockets to minimize inventory of parts. A different "z" segment is actively used in each of the shared continuity module 319 designs at the different socket positions—the inactive "z" segments do not carry signals.

The continuity modules 319 occupy the first five socket sites. The CA links don't connect to the continuity sockets, so the CA loading may be reduced in these partial-capacity systems. If equalization is being used for the CA links, it can be adjusted for the capacity option.

In this case, the loaded module connects directly to one group wire 330 and to five group wires 340. The five continuity modules 319 connect the remaining five group wires 330 to these five group wires 340. The module 302 connects to the controller 354 on all six group wires (this pattern may be repeated three times in each module, once for each DQ buffer). This is the minimum capacity option.

In other embodiments, a mother board substrate has at least three memory module sockets and at least one of these module sockets is populated with a memory module as described above with respect to FIG. 2c. For example, the memory module includes multiple device sites coupled to a DQ buffer component via data lines and coupled to a CA buffer component via CS lines. As described above, a first number of the CS lines between the CA buffer component and any combination of two or more of the device sites is greater than a second number of the CS lines between the CA buffer component and a single one of the device sites. The CS lines may each correspond to a different rank of the memory module.

Rank Mapping in Standard Memory System

FIG. 4 shows a standard system 400 populated with 3 modules 402. In this example, each device site 406 contains a single memory component, but is otherwise identical to the system previously discussed in FIG. 2a.

In FIG. 4, an access is made to rank 0. The system 400 contains 3 ranks in total: {0,1,2}. The ranks on a particular module 402 are selected using the standard chip-select signals (CS of the accompanying the secondary CA links). In this case, only one of the four CS links per module is needed. An embodiment with more devices per device site would need more of the CS links.

A key point to note in FIG. 4 is one device in each of the 18 device sites 406 across the module 402 responds to an access. Every access is satisfied by the devices on a single module.

Further, each secondary group of data-links is connected directly across the data-link buffer (DQ-BUF) 415 to the corresponding primary group of data-links. Every access uses this same primary-to-secondary group mapping.

It should also be noted that memory systems like the memory system 400 the CS line on one memory module 402 goes to all the device sites. Thus, the number of CS lines that go to any two device sites is the same as the number of CS lines that go to any one of the device sites, since the same CS line goes to all the device sites, Rank Mapping in Improved Memory System FIG. 5 shows an improved system 500 populated with 6 modules 502. In this example, each device site 506 contains a single memory component, but is otherwise identical to the system previously discussed in FIG. 2c.

In FIG. 5, an access is made to rank 0. The system contains six ranks, in total: {0,1,2,3,4,5}. The ranks on a particular module are selected using the secondary decoded chip-select signals CSd. These have been decoded from the primary encoded chip-select signal CSe.

A key point to note in FIG. 5 is one device in the six device sites 506 connected to each data-link buffer responds to an access. The three data-link buffers on each module thereby cause three secondary data-link groups to connect to three primary data-link groups.

The three data buffers 515 in each module 502 access the same secondary data-link groups (i.e. the same device in the six device sites). However, each data-link buffer transmits and receives on a different set of three primary data-link groups, as indicated by the connection lines 520 in FIG. 5.

Every access is satisfied by a subset of the device sites 506 on a single module 502. Every access also involves the same device site subset on every module 506.

Further, each secondary group of data-links is connected across the data-link buffer (DQ-BUF) 515 to a different primary group of data-links on every module. An access to a different rank uses a different primary-to-secondary group mapping.

It should be noted that by distributing 6 decoded CS signals to the 18 memory devices on each module, no memory device modifications are needed (only changes to the memory controller component 254 to send encoded CS signals and to the CA buffer component 514 to decode the encoded CS signals). The CSe encoded chip select information is decoded to one of 6 ranks (1 memory device) on each module 502. Each of the six modules 502 enables one memory device on a different 4b group lane. A first number of primary CS lines coupled between respective ones of the module connector pins and the CA buffer component 514 is less than a second number of secondary CS lines coupled between the CA buffer component 514 and the memory components (e.g., 6 CSd). This first number of primary CS lines is less than a third number of ranks of the memory components at the device sites 506 (e.g., 6 ranks) The second number of secondary CS lines may be equal to the number of ranks. The encoded CS information can be received by each of the CA buffer components 514 on each of the modules 502 over the primary CS lines. The CA buffer components 514 decode the encoded CS information to obtain the decoded CS information, selecting one of the six ranks using the six secondary CS lines on each of the modules 702. An individual CA buffer component 514 may receive encoded chip select information on the primary CS lines coupled between the module connector pins and the CA buffer component 514. The CA buffer component 514 decodes the encoded chip select information received on the primary CS lines to obtain decoded CS information and sends the decoded CS information on the secondary CS lines coupled between the CA buffer component 514 and the memory components at the corresponding device site 506. The decoded CS information selects one of multiple ranks, where the first number of the primary CS lines is less than a number of the multiple ranks and the second number of the secondary CS lines is equal to the number of the multiple ranks Improved Link Topology of 18 Modules FIG. 6a shows the physical link topology 600 of an 18-module system. It is similar to the 6-module system already discussed.

CA Link of 18 Modules

The CA link topology 600 is similar to the six module system, except that there are a larger number of modules, resulting in more loads along the controller-impedance wire.

The extra loading on the CA link may lead to the same reduction in propagation speed of signals. This may cause a larger increase in latency, but can be compensated for since the CA links include a timing signal CK which sees the same delay.

A second effect of the loading will be to reduce the characteristic impedance of the motherboard trace in the module section. The impedance change between the loaded and unloaded sections of the motherboard links can also create reflections and add to ISI.

It is possible to adjust the trace width of the links, widening them in the unloaded sections and narrowing them in the loaded sections to reduce the impedance mismatch.

This can also be done to the trace widths on the module, to compensate for impedance variations through the socket structure that connects a module pin to a motherboard trace. This can be important because the socket structure changes the geometry and spacing of the two-wire conductor carrying the signal.

Another way to deal with the ISI is to use decision-feedback-equalization (DFE) or similar techniques. This approach uses the past symbol-values that were transmitted on a link, and computes an approximation for the reflection noise they have created. This approximation can be subtracted from the signal (at the transmitter or receiver) to get a better value for the current symbol being transferred.

There may also be the same attenuation issue as in the 6-module system, except it may be larger. It should be noted that the attenuation per unit length will be about the same in both systems, but the CA wire is longer in the 18-module system 600 to accommodate the additional modules, hence the increase.

As before, this is addressed by reducing the signaling rate of the CA relative to that of the DQ. The CA links transfer one bit per clock cycle, whereas the DQ links transfer two bits per clock cycle (twice the signaling rate).

The CA rate can be lowered further so that one bit is transferred every two clock cycles (this is called 2T signaling, as compared to the normal 1T signaling).

Another option is to add transmit equalization to the controller, or receive equalization to the buffer. This causes the higher frequency components of the signal to be selectively amplified, to compensate for the attenuation (which affects the high-frequency components the most).

Another option is to duplicate the CA interface so that each interface (A and B) drives half the modules; nine modules each in this case. This is shown in a memory system 650 of FIG. 6b.

DQ Link of 18 Module

The DQ link topology 650 may be virtually identical with the 6-module system. The DQ link topology 650 may include a transmitter and receiver on the controller and a controlled-impedance wire on a motherboard substrate, as before. Inside the DQ buffer of a module there is a termination device, a receiver, and a transmitter, as before. There are several key differences in the way these are connected together as set forth in the following:

[1] The DQ link connects to a single module in a point-to-point topology. This may give the best possible signaling quality, since the receiver and transmitter are at opposite ends of a controlled-impedance wire, and a termination device may be enabled at the receiver end of the link.

[2] The link includes a segment (the "x" segment) of wire on the motherboard, a connection through two pins of a continuity module (the "z" segment), and a second segment of wire on the motherboard (the "y" segment). Some DQ links may only go through a single segment of wire on the motherboard (no connection through a continuity module).

The continuity module is a standard module substrate with no active devices. It plugs into a standard socket, and connects some of the DQ links to other DQ links with a controlled impedance wire.

This connection through a continuity module may introduce some discontinuities to the link, mainly by the socket connection to the continuity module pins. This is because the geometry and spacing of the two-conductor transmission line changes at these socket connections.

Each DQ link sees an impedance change at the meeting point of the "x" and "z" segments, and an impedance change at the meeting point of the "z" and "y" segments. These impedance changes can create reflections and add to ISI.

It is possible to compensate partially for these impedance changes by adjusting the trace widths if the DQ link on the module.

Another way to deal with the ISI is to use decision-feedback-equalization (DFE) or similar techniques. This approach uses the past symbol-values that were transmitted on a link, and computes an approximation for the reflection noise they have created. This approximation can be subtracted from the signal (at the transmitter or receiver) to get a better value for the current symbol being transferred.

Because of this simpler DQ link topology, the embodiments of the improved system may have better DQ signal quality (even with the continuity module) than the standard system.

The improved system may also avoid the need to introduce idle cycles (bubbles) between accesses to different modules.

The principle difference with respect to the 6-module system is that the two motherboard wire segments for each group will be longer, causing a slight increase in attenuation.

There may also be more continuity modules needed to accommodate the various capacity options: {1,2,3,6,9,18} modules.

System Details of 18-Module System

FIG. 7a shows an improved system 700 with 18 modules. In addition to the minor differences in the physical link topology, there may be some differences in the encoding and decoding of the chip-select signals to accommodate the higher module capacity.

The controller component 704 is shown in FIG. 7a. It connects to 108 DQ links and 41 CA links. This is equal to the link count for 6 module improved system as shown in FIG. 2c. Alternatively, as described herein, the improved memory system 700 may include any number of modules, including memory systems with any of the following numbers of modules: 1, 2, 3, 4, 6, 8, 9, 16 or 18 as described herein.

The 108 DQ links includes 72 DQ data-links and 36 DQS timing links. This link count includes the extra links needed for standard error detection and correction codes. This includes standard (Hamming) ECC bit codes and standard "Chip-kill" symbol codes.

An additional capability of a fully loaded 18-module system which is using a chip-kill symbol code is the ability to provide correction for a failed module; i.e. a module that cannot supply any data.

A chip-kill symbol code may provide correction for a single failed ×4 memory device. The fully loaded 18-module system may be accessing one group from each of the 18 modules on every read or write operation. If one module has failed ("module-kill"), they the group that it provides can be corrected by the symbol code being used.

The 41 CA links include 12 CS (chip-select) links for standard operation (this allows four ranks of memory devices on each of three standard modules).

In an improved 18-module system, these 12 CS links are re-tasked by a control method. Six of the links are redefined as encoded chip-selects (CSe), and the remaining six links are reserved (for additional chip-selects when more capacity is needed).

The 6 CSe links and 29 additional CA links (with command, control and address) are connected to the 18 modules via motherboard wires in a multi-drop topology as previously discussed.

These 35 links are received by the CA buffer (CA-BUF) component 714 on each module 702.

The 29 CA links are retransmitted in a secondary multi-drop topology to the 18 device sites 706 on the module 702. A device site 706 can include one or more 4-bit memory devices. This example has two devices stacked at each device site 706 as illustrated in FIG. 7b.

The 6 CSe links are decoded and retransmitted as 36 CSd links in the secondary multi-drop topology to the 18 device sites on the module.

The 36 CSd links connect to one device each in the 18-device sites 706 (there are two devices per site in this example as illustrated in FIG. 7b).

In each access, each DQ buffer accesses one of the 36 devices attached to its secondary DQ links, and couples it to one of the 18 primary DQ groups to which it connects.

The DQ buffer includes an 18×18×4b crossbar switch to accomplish this switching. A full crossbar switch is necessary so that a module 702 may occupy any socket position in a system of any allowable capacity. This means that a four-DQ group (including two DQS links) can be steered from any of the 18 secondary groups (connecting to the memory devices) to any of the 18 primary groups (connecting to the controller component).

It should be noted that in FIG. 7a the DQ links are shown with a multi-drop topology. These links employ a special DPP topology (dynamic point-to-point), and will be described in the next several figures.

It should be noted that by distributing 36 decoded CS signals to the 36 memory devices on each module, no memory device modifications are needed (only changes to the memory controller component 704 to send encoded CS signals and to the CA buffer component 714 to decode the encoded CS signals). The 6×CSe encoded chip select are decoded to one of 36 ranks (1 memory device) on each module 702. Each of the eighteen modules enables one memory device on a different 4b group lane.

As illustrated and described herein, there may be a first number of primary CS lines (e.g., 6 CSe) coupled between respective ones of the module connector pins and the CA buffer component 714 and a second number of secondary CS lines coupled between the CA buffer component 714 and the memory components (e.g., 36 CSd). This first number of primary CS lines is less than a third number of ranks of the memory components at the device sites 256 (e.g., 36 ranks) The second number of secondary CS lines may be equal to the number of ranks. The encoded CS information can be received by each of the CA buffer components 714 on each of the modules over the six primary CS lines. The CA buffer components 714 decode the encoded CS information to obtain the decoded CS information, selecting one of the thirty-six ranks using the thirty-six secondary CS lines on each of the modules 702. An individual CA buffer component 714 may receive encoded chip select information on the primary CS lines coupled between the module connector pins and the CA buffer component 714. The CA buffer component 714 decodes the encoded chip select information received on the primary CS lines to obtain decoded CS information and sends the decoded CS information on the secondary CS lines coupled between the CA buffer component 714 and the memory components at the device sites. The decoded CS information selects one of multiple ranks, where the first number of the primary CS lines is less than a number of the multiple ranks and the second number of the secondary CS lines is equal to the number of the multiple ranks.

Motherboard Wiring for 18-Module System

FIG. 8 shows the motherboard wiring pattern 800 for the 18 DQ groups. Each group includes 4 DQ data-links and 2 DQS timing links.

In FIG. 8, lines 830 represent the first segment of motherboard wire for a group, and line 840 represent the second segment of motherboard wire for a group. The squares 834 represent the sockets for each group of a module. A continuity module is needed to connect a first motherboard wire segment to a second motherboard wire segment. In some configurations, the first motherboard wire segment makes the desired connection.

It should be noted that the motherboard wiring pattern and the wiring pattern on the continuity modules is not unique; other sets of patterns are possible.

The motherboard wiring pattern is somewhat congested along the diagonal of the socket array. The horizontal group lanes can be rearranged in any order to reduce this congestion.

For example, the topmost group lane (group[0]) could be moved down so it is between group[16] and group[17] at the bottom. Group[1]) could be moved down so it is between group[15] and group[16], and so on.

FIG. 9 shows the 18-module system 900 with one socket filled with a module containing memory devices. The other 17 sockets contain continuity modules. This system example requires a set of 17 continuity module designs which match the different group wiring patterns 950.

Each of the 17 modules would include other connection patterns so they could be reused for the other capacity configurations, as was shown for the 6-module system and its four continuity module designs {C0,C1,C2,C3}.

In each continuity module with shared "z" segments, only one of the "z" segments will be active in a particular socket of a particular capacity configuration—the inactive "z" segments will not transfer a signal.

The continuity modules occupy the first 17 socket sites. The CA links don't connect to the continuity sockets, so the CA loading may be reduced in these partial-capacity systems. If equalization is being used for the CA links, it can be adjusted for the capacity option.

In this case, the loaded module connects directly to one group wire 930 and to 17 group wires 940. The 17 continuity modules connect the remaining 17 group wires 930 to these 17 group wires 940. The module may connect to the controller on all 18 groups. This is the minimum capacity option.

FIG. 10 shows the 18-module system 1000 with two sockets filled with modules containing memory devices. The other 16 sockets contain continuity modules. These continuity modules would be from the same set of 17 that were used in FIG. 9.

The continuity modules occupy 8/9 of the socket sites in a repeating pattern. The CA links don't connect to the continuity sockets, so the CA loading may be reduced in these partial-capacity systems. If equalization is being used for the CA links, it can be adjusted for the capacity option.

In this case, each module connects directly to one group wire 1030 and to 8 group wires 1040. The 16 continuity modules connect the remaining 16 group wires 1030 to these 2×8 group wires 1040. Each module connects to the controller on 9 groups.

FIG. 11 shows the improved system 100 with three sockets filled with modules containing memory devices. The other 15 sockets contain continuity modules, pulled from the set of 17 continuity modules in FIG. 9.

The continuity modules occupy 5/6 of the socket sites. The CA links don't connect to the continuity sockets, so the CA loading may be reduced in these partial-capacity systems. If equalization is being used for the CA links, it can be adjusted for the capacity option.

In this case, each module connects directly to one group wire 1130 and to 5 group wires 1140. The 15 continuity modules connect the remaining 15 group wires 1130 to these 3×5 group wires 1140. Each module connects to the controller on 5 groups.

FIG. 12 shows the improved system 1200 with 6 sockets filled with modules containing memory devices. The other 12 sockets contain continuity modules, pulled from the set of 17 continuity modules in FIG. 9.

The continuity modules occupy two or three of the socket sites. The CA links don't connect to the continuity sockets, so the CA loading may be reduced in these partial-capacity systems. If equalization is being used for the CA links, it can be adjusted for the capacity option.

In this case, each module connects directly to one group wire 1230 and to 2 group wires 1240. The 12 continuity modules connect the remaining 12 group wires 130 to these 2×6 group wires 1240. Each module connects to the controller on 3 groups.

FIG. 13 shows the 18-module system 1300 with 9 sockets filled with modules containing memory devices. The other 9 sockets contain continuity modules, pulled from the set of 17 continuity modules in FIG. 9.

The continuity modules occupy 1/2 of the socket sites. The CA links don't connect to the continuity sockets, so the CA loading may be reduced in these partial-capacity systems. If equalization is being used for the CA links, it can be adjusted for the capacity option.

In this case, each module connects directly to one group wire 1330 and to 1 group wire 1340. The 9 continuity modules connect the remaining 12 group wires 1230 to these 9 group wires 1340. Each module connects to the controller on 2 groups.

FIG. 14 shows the 18-module system 1400 with all 18 sockets filled with modules containing memory devices. In this case, each module connects directly to a group wire 1430, indicating that each module can communicate with the controller via a single wire segment on the motherboard. It should be noted that each DQ buffer may need to steer data from a different primary DQ group position to the desired site (and desired memory component). This figure should make it clear why the full 18×18×4b crossbar switch is required in each DQ buffer.

System Details of Alternate 6-Module System

FIG. 15*a* shows a 6-module system 1500 with six modules. This is similar to the 6-module system shown in FIG. 2, except that each device site utilizes a higher density packaging technology. The system in FIG. 2 had assumed that a more limited form of package stacking was used.

Figure 15B:
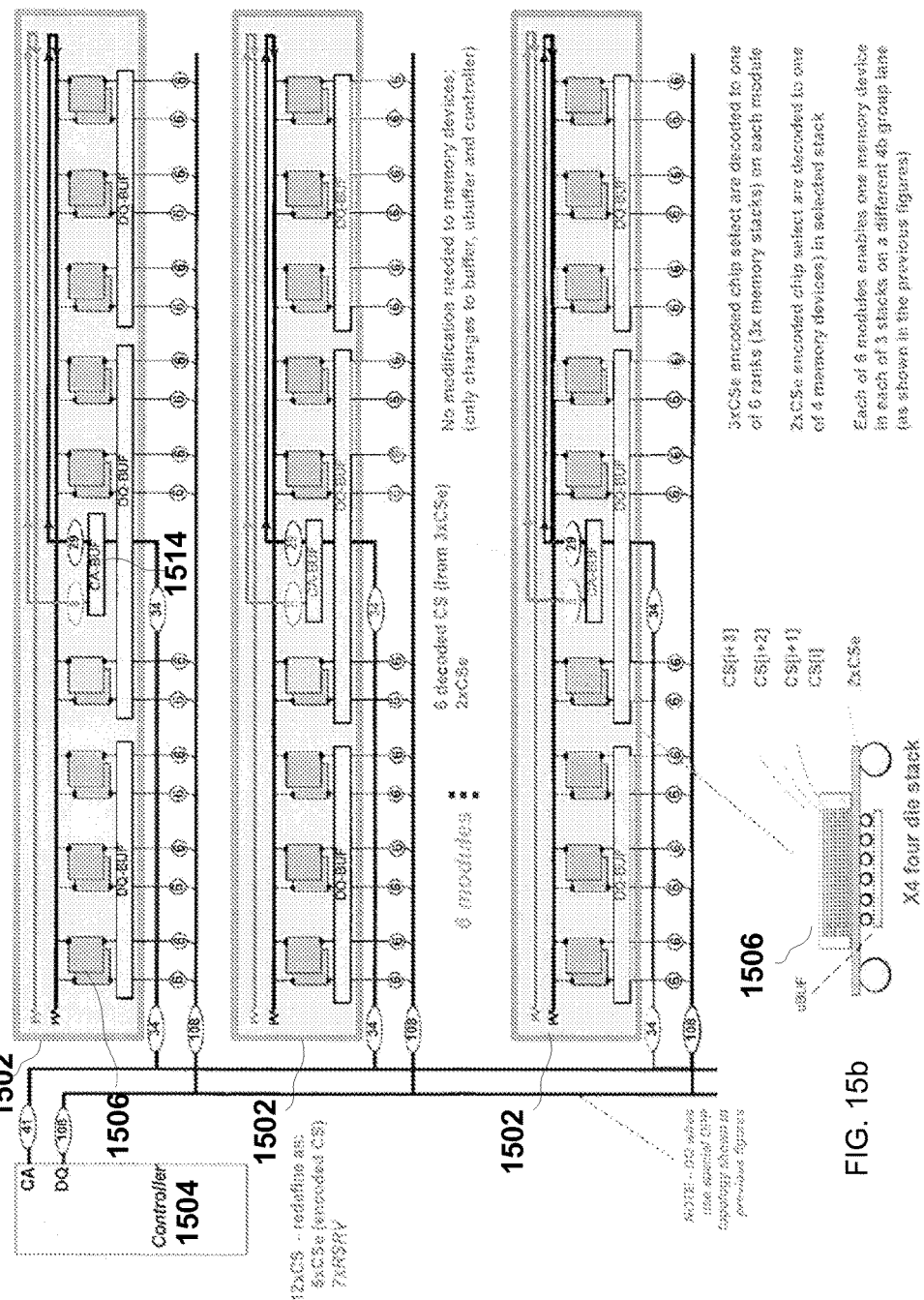
FIG. 15b shows a four die stack at a device site of the six-module system of FIG. 15a according to one implementation.

In this example, it is assumed that four silicon die are stacked inside a single package. It is also assumed that the stacked assembly includes a simple buffer device (uBUF), as shown in FIG. 15*b*. Alternatively one of the memory devices in the stack can perform the buffering function; that is, one memory device would include an interface to the secondary links connecting to the DQ-BUF and CA-BUF and an interface to the tertiary links connecting to the other memory devices in the stack.

A key consequence of this higher density packaging is that more memory devices need to be controlled. This would be managed by re-tasking more of the reserved chip-select links from the standard definition.

The controller component is shown in the upper left of the figure. It connects to 108 DQ links and 41 CA links, as in the previous figures.

In this alternate system, these 12 CS links are re-tasked by a control method. Five of the links are redefined as encoded chip-selects (CSe), and the remaining seven links are reserved (for additional chip-selects when more capacity is needed).

The 5 CSe links and 29 additional CA links (with command, control and address) are connected to the six modules via motherboard wires in a multi-drop topology as previously discussed.

These 34 links are received by the CA buffer (CA-BUF) component on each module.

The 29 CA links are retransmitted in a secondary multi-drop topology to the 18 device sites on the module. This example has four devices stacked at each device site as shown in FIG. 15*b*.

The 5 CSe links are decoded and retransmitted as 6 CSd links and 2 CSe links in the secondary multi-drop topology to the 18 device sites on the module.

The 18 device sites are broken into three sets of 6-device sites. Each of these 6-device sites connects to a DQ buffer component (DQ-BUF) via the secondary DQ links.

The 6 CSd links connect to the uBUF device in each of the 6-device sites. The two encoded CSe links are decoded by the uBUF device to select one of the four memory devices in the stack.

In each access, each DQ buffer accesses one of the 24 devices attached to its secondary DQ groups, and couples it to one of the six primary DQ groups to which it connects.

The DQ buffer includes a 6×6×4b crossbar switch to accomplish this switching. A full crossbar switch is necessary so that a module may occupy any socket position in a system of any allowable capacity. This means that a four-DQ group (including two DQS links) can be steered from any of the six secondary groups (connecting to the memory devices) to any of the six primary groups (connecting to the controller component).

It should be noted that in FIG. 15*a* the DQ links are shown with a multi-drop topology. These links employ a special DPP topology (dynamic point-to-point), as has been described in previous figures.

It should be noted that by distributing 8 decoded CS signals to the 72 memory devices on each module, no memory device modifications are needed (only changes to the memory controller component 1504 to send encoded CS signals and to the CA buffer component 1514 to decode the encoded CS signals). The 3×CSe encoded chip select are decoded to one of 6 ranks (3× memory stacks) on each module 1502 and 2×CSe encoded chip select are decoded to one of four memory devices in the selected stack. Each of the six modules 1502 enables one memory device in each of 3 stacks on a different 4b group lane.

As illustrated and described herein, there may be a first number of primary CS lines (e.g., 5 CSe) coupled between respective ones of the module connector pins and the CA buffer component 1514 and a second number of secondary CS lines coupled between the CA buffer component 1514 and the memory components (e.g., 8 CSd, including 6 decoded CSd and 2×CSe for the tertiary CS at a device site 1506 having a stack of four memory devices). This first number of primary CS lines is less than a third number of ranks of the memory components at the device sites 506 (e.g., 6 ranks) The second number of secondary CS lines may be greater than the number of ranks because additional secondary CS lines are used to decode which memory devices to select at the device site 1506. For example, 8 secondary CS lines are used in FIG. 15*a*, six of which are used to select one of 6 ranks and two of which are used to select which memory device at the selected device site 1506. The encoded CS information can be received by each of the CA buffer components 1514 on each of the modules 1502 over the five primary CS lines. The CA buffer components 1514 decode the encoded CS information to obtain the decoded CS information, selecting one of the six ranks using the eight secondary CS lines on each of the modules 1502 (six secondary CS lines to select a device site and two CS lines to select a memory component at the selected device site). An individual CA buffer component 1514 may receive encoded chip select information on the primary CS lines coupled between the module connector pins and the CA buffer component 1514. The CA buffer component 1514 decodes the encoded chip select information received on the primary CS lines to obtain decoded CS information and sends the decoded CS information on the secondary CS lines coupled between the CA buffer component 1514 and the memory components at the device sites 1506. The decoded CS information selects one of multiple ranks, where the first number of the primary CS lines is less than a number of the multiple ranks and the second number of the secondary CS lines is greater than the number of the multiple ranks as described herein.

System Details of Alternate 18-Module System

FIG. 16*a* shows an 18-module system 1500 with 18 modules. This is similar to the 18-module system shown in FIG. 7*a*, except that each device site utilizes a higher density packaging technology. The system 700 in FIG. 7*a* had assumed that a more limited form of package stacking was used.

In this example, it is assumed that four silicon die are stacked inside a single package. It is also assumed that the stacked assembly includes a simple buffer device (uBUF), as shown in FIG. 16b. Alternatively one of the memory devices in the stack can perform the buffering function; that is, one memory device would include an interface to the secondary links connecting to the DQ-BUF and CA-BUF and an interface to the tertiary links connecting to the other memory devices in the stack.

A key consequence of this higher density packaging is that more memory devices need to be controlled. This would be managed by re-tasking more of the reserved chip-select links from the standard definition.

The controller component is shown in the upper left of the figure. It connects to 108 DQ links and 41 CA links, as in the previous figures.

In this alternate system, these 12 CS links are re-tasked by a control method. Seven of the links are redefined as encoded chip-selects (CSe), and the remaining five links are reserved (for additional chip-selects when more capacity is needed).

The 7 CSe links and 29 additional CA links (with command, control and address) are connected to the six modules via motherboard wires in a multi-drop topology as previously discussed.

These 36 links are received by the CA buffer (CA-BUF) component on each module.

The 29 CA links are retransmitted in a secondary multi-drop topology to the 18 device sites on the module. This example has four devices stacked at each site as shown in FIG. 16b.

The 7 CSe links are decoded and retransmitted as 18 CSd links and 2 CSe links in the secondary multi-drop topology to the 18 device sites on the module.

The 18 CSd links connect to the uBUF device each in each of the device sites. The two encoded CSe links are decoded by the uBUF device to select one of the four memory devices in the stack.

In each access, the DQ buffer accesses one of the 72 devices attached to its secondary DQ groups, and couples it to one of the 18 primary DQ groups to which it connects.

The DQ buffer includes an 18×18×4b crossbar switch to accomplish this switching. A full crossbar switch is necessary so that a module may occupy any socket position in a system of any allowable capacity. This means that a four-DQ group (including two DQS links) can be steered from any of the 18 secondary groups (connecting to the memory devices) to any of the 18 primary groups (connecting to the controller component).

It should be noted that in FIG. 16a the DQ links are shown with a multi-drop topology 1600. These links employ a special DPP topology (dynamic point-to-point), as has been described in previous figures.

It should be noted that by distributing 20 decoded CS signals to the 72 memory devices on each module, no memory device modifications are needed (only changes to the memory controller component 1604 to send encoded CS signals and to the CA buffer component 1614 to decode the encoded CS signals). The 5×CSe encoded chip select are decoded to one of 18 ranks (memory stacks) on each module 1602 and 2×CSe encoded chip select are decoded to one of four memory devices in the selected stack. Each of the 18 modules 1602 enables one memory device in one stack on a different 4b group lane.

As illustrated and described herein, there may be a first number of primary CS lines (e.g., 12 CSe) coupled between respective ones of the module connector pins and the CA buffer component 1614 and a second number of secondary CS lines coupled between the CA buffer component 1614 and the memory components (e.g., 20 CSd, including 18 decoded CSd and 2×CSe for the tertiary CS at a device site 1606 having a stack of four memory devices). This first number of primary CS lines is less than a third number of ranks of the memory components at the device sites 1606 (e.g., 18 ranks) The second number of secondary CS lines may be greater than the number of ranks because additional secondary CS lines are used to decode which memory devices to select at the device site 1606. For example, 20 secondary CS lines are used in FIG. 16a, eighteen of which are used to select one of 18 ranks and two of which are used to select which memory device at the selected device site 1606. The encoded CS information can be received by each of the CA buffer components 1614 on each of the modules 1602 over the twelve primary CS lines. The CA buffer components 1614 decode the encoded CS information to obtain the decoded CS information, selecting one of the eighteen ranks using the twenty secondary CS lines on each of the modules 1602 (eighteen secondary CS lines to select a device site and two CS lines to select a memory component at the selected device site). An individual CA buffer component 1614 may receive encoded chip select information on the primary CS lines coupled between the module connector pins and the CA buffer component 1614. The CA buffer component 1614 decodes the encoded chip select information received on the primary CS lines to obtain decoded CS information and sends the decoded CS information on the secondary CS lines coupled between the CA buffer component 1614 and the memory components at the device sites 1606. The decoded CS information selects one of multiple ranks, where the first number of the primary CS lines is less than a number of the multiple ranks and the second number of the secondary CS lines is greater than the number of the multiple ranks as described herein.

Example Embodiments

[1] A memory module with two modes of operation; a first mode, in which it can be inserted onto a first type of memory channel with multi-drop data-links which can be shared with at least one other module, and a second mode in which it can be inserted onto a second type of memory channel with point-to-point data-links which are not shared by other modules.

Data-Link Example Embodiments

[1a] The module [1], with a primary data interface which can be connected to a memory channel, with this primary data interface divided into groups of G data-links, each group with a data timing link

[1b] The module [1a], with the primary data interface further divided into N groups of G data-links, with each N*G data-link primary interface contained within one data-link buffer device

[1c] The module [1b], with each data-link buffer device containing a second interface connecting to N*G secondary data-links, connecting to N device sites, with each secondary data-link group connecting to one device site.

[1ca] The module [1c], in which each device site contains one of {a single memory device, a package stack of at least two memory devices, a die stack of at least two memory devices}.

[1d] The module [1c] during a memory access in the first mode, connecting each one of the N primary data-link groups to each one of the N secondary data-link groups, in a fixed mapping that is the same for all memory accesses

[1e] The module [1c] during a first memory access in the second mode, connecting one of the N primary data-link groups to one of the N secondary data-link groups, and during a second memory access, connecting the primary data-link group to a different one of the N secondary data-link groups

[1f] The module [1c] in the second mode in which each data-link buffer utilizes a symmetric N*N cross-bar switch, capable of connecting any one of the N primary data-link groups to any one of the N secondary data-link groups

[1g] The module [1c] with M data-link buffer devices, where M*N*G is the number of data-links contained by the memory channel

[1ga] The module [1g] in the second mode in which each data-link buffer only transmits and receives on a subset of the N primary data-link groups to which it interfaces, and which does not transmit and receive on the remaining primary data-link groups.

[1gb] The module [1ga] in which the number of data-links per memory channel (M*N*G) is 72 and in which the triplet {M,N,G} is one of {1,18,4}, {2,9,4}, {3,6,4}, {1,9,8}, {3,3,8}.

[1gba] The module [1gb] in which the number of primary data-link groups on which each data-link buffer transmits and receives is one of {18,9,6,3,2,1}

[1gc] The module [1ga] in which the number of data-links per memory channel (M*N*G) is 64 and in which the triplet {M,N,G} is one of {1,16,4}, {2,8,4}, {4,4,4}, {1,8,8}, {2,4,8}.

[1gca] The module [1gc] in which the number of primary data-link groups on which each data-link buffer transmits and receives is one of {16,8,4,2,1}

Command-Address Link Example Embodiments for Module

[1h] The module [1] with a primary command-address interface which can be connected to a memory channel, with this interface contained within a command-address-link buffer device.

[1ha] The module [1h] in which the command-address-link buffer device includes a secondary command-address-link interface which connects to the device sites of the module

[1hb] The module [1ha] in which the command-address-link buffer device, in the first mode, can receive a set of decoded, one-hot chip-select control signals on the primary command-address interface, passes these chip-select control signals to the secondary command-address interface, to enable one memory device in each device site to perform the command specified on the other command-address-links

[1hc] The module [1ha] in which the command-address-link buffer device, in the second mode, can receive a set of encoded, chip-select control signals on the primary command-address interface, and generates a set of decoded chip-select control signals on the secondary command-address interface, to enable one memory device in a subset of the device sites to perform the command specified on the other command-address-links

[1hd] The module [1hc], which connects to a memory channel with 72 data-links, which includes M data-link buffer devices each connected to N device sites via secondary data-links, in which the subset of device sites enabled for each command is one of {1,2,3,6,9,18}

[1he] The module [1hc], which connects to a memory channel with 64 data-links, which includes M data-link buffer devices each connected to N device sites via secondary data-links, in which the subset of device sites enabled for each command is one of {1,2,4,8,16}

Controller Example Embodiments

[2] A memory controller component with two modes of operation; a first mode, in which it can be inserted onto a first type of memory channel with multi-drop data-links which can be shared by at least two modules, and a second mode in which it can be inserted onto a second type of memory channel with point-to-point data-links which are not shared by modules.

[2a] The controller component [2] with a primary command-address interface which can be connected to a memory channel in the first mode, can transmit a set of decoded, one-hot chip-select control signals on the primary command-address interface.

[2b] The controller component [2] with a primary command-address interface which can be connected to a memory channel in the second mode, can transmit a set of encoded, chip-select control signals on the primary command-address interface.

[2c] The controller component [2] with a primary data interface which can be connected to a memory channel in the second mode, in which a second mode memory access transfers one data-link-group per module, in which an access includes a syndrome which can detect and correct single group errors with a standard symbol-based EDC chipkill code, can keep track of errors generated during a sequence of accesses to determine that one module in the system has failed, and can correct for the failure of that module System Example Embodiments

[3] A memory system including a controller component, a motherboard substrate with module sockets, and at least two memory modules, operated in a mode with unshared, point-to-point data-links to at least two modules, and in which the controller component and at least two memory modules can be used in an alternative system in an alternate mode with an alternate motherboard substrate with shared, multi-drop data-links between controller and at least two memory modules.

[3a] The memory system [3] in which the number of data-links is 64 and in which in the second mode the sockets may be populated with one of {1,2,4,8,16} memory modules

[3b] The memory system [3] in which the number of data-links is 72, and in which an error detection and correction is utilized by the controller

[3c] The memory system [3a] in which in the second mode the controller can detect and correct for the failure of a complete module

[3d] The memory system [3a] in which in the second mode the sockets may be populated with one of {1,2,3,6,9,18} memory modules

[3d] The memory system [3] in which in the second mode the motherboard includes a wiring segment for each group of data links with a timing link, and in which the wiring segment is different for each group which connects to the controller component (the "x" segments).

[3d] The memory system [3] in which in the second mode the motherboard includes a wiring segment for each group of data links with a timing link, and in which the wiring segment is different for each group which connects each rank of socket connections (the "y" segments).

[3e] The memory system [3] in which in the second mode the sockets with no memory module are occupied by a continuity module which connects at least one pair of data link groups with a timing link, with one of each pair being connected to an "x" data-link group on the motherboard, and with the other of each pair being connected to an "y" data-link group on the motherboard.

[3e] The memory system [3f] in which the active "z" segment connecting a pair of data-link segments on the motherboard on continuity modules are different in each socket position, and different in each capacity configuration.

[3f] The memory system [3e] in which the wiring pattern of the motherboard and the wiring pattern of the continuity modules ensures that no data-link between the controller and a memory module traverses no more than a single continuity module.

Figure 17:
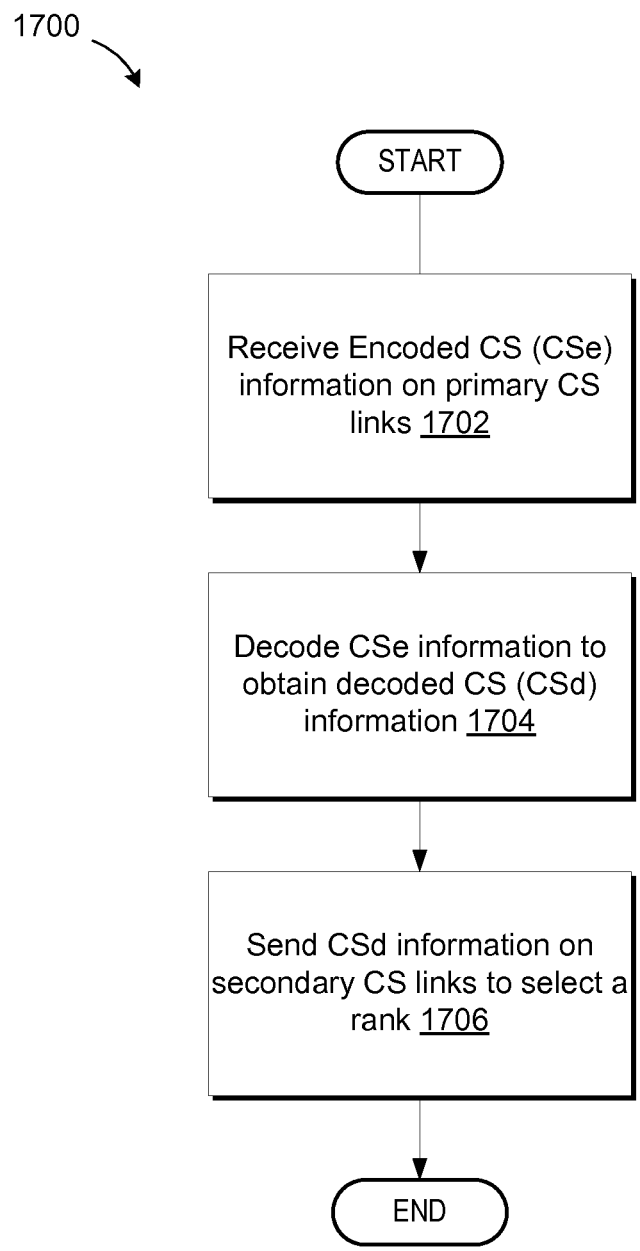
FIG. 17 is a flow diagram of a method of operating a CA buffer component according to an embodiment.

FIG. 17 is a flow diagram of a method 1700 of operating a CA buffer component according to an embodiment. The method 1700 begins with the CA buffer component receiving encoded CSe information on primary CS links (block 1702). The CA buffer component decodes the encoded CSe information to obtain decoded CSd information (block 1704). The CA buffer component sends the decoded CSd information on secondary CS links (block 1706), and the method 1700 ends. In other embodiments, the functionality of the CA buffer component may also be performed in connection with method 1700. In other embodiments, the functionality of the DQ buffer component can be implemented in similar methods as described herein.

Figure 18:
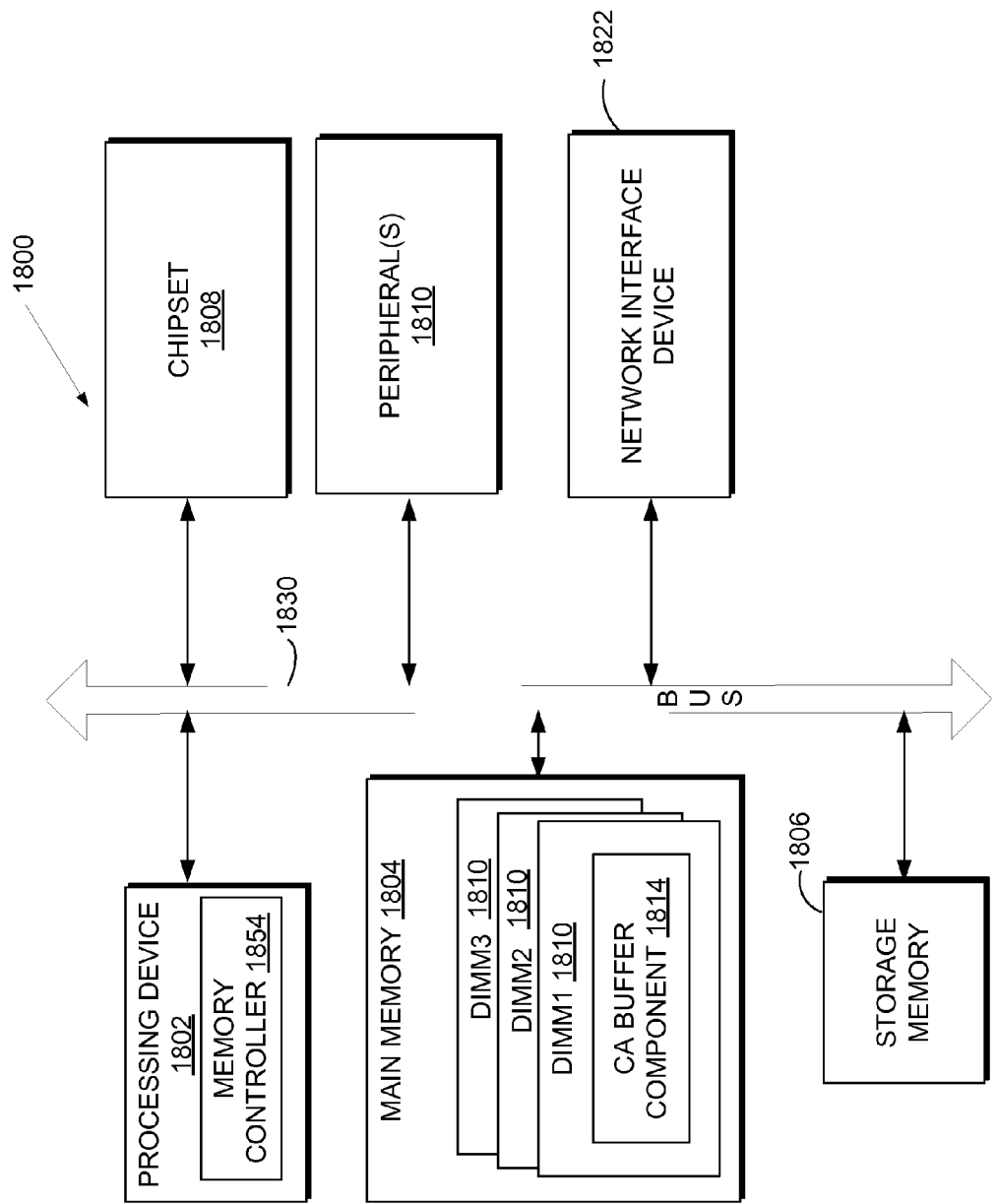
FIG. 18 is a diagram of one embodiment of a computer system, including main memory with three memory modules with the CA buffer components according to one embodiment.

FIG. 18 is a diagram of one embodiment of a computer system, including main memory 1804 with three memory modules 1810 with the CA buffer components 1814 according to one embodiment. The computer system 1800 may be connected (e.g., networked) to other machines in a LAN, an intranet, an extranet, or the Internet. The computer system 1800 can be a host in a cloud, a cloud provider system, a cloud controller, a server, a client, or any other machine. The computer system 1800 can operate in the capacity of a server or a client machine in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The computer system 1800 includes a processing device 1802 (e.g., host processor or processing device), a main memory 1804 (e.g., read-only memory (ROM), flash memory, dynamic random access memory (DRAM), a storage memory 1806 (e.g., flash memory, static random access memory (SRAM), etc.), and a secondary memory 1818 (e.g., a data storage device in the form of a drive unit, which may include fixed or removable computer-readable storage medium), which communicate with each other via a bus 1830. The main memory 1804 includes the memory modules 1810 and DQ buffers 1814 that are described in various embodiments herein.

Processing device 1802 represents one or more general-purpose processing devices such as a microprocessor, central processing unit, or the like. More particularly, the processing device 1802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1802 may also be one or more special-purpose processing devices such as an application specific integrated circuit (ASIC), a field programmable gate array (FPGA), a digital signal processor (DSP), network processor, or the like. Processing device 1802 includes a memory controller 220 as described above. The memory controller 1854 is a digital circuit that manages the flow of data going to and from the main memory 1804. The memory controller 1854 can be a separate integrated circuit, but can also be implemented on the die of a microprocessor. The memory controller 1854 may the memory controller described in various embodiments described herein, such as memory controller 1854 configured to send encoded CS signals to the main memory 1804.

In one embodiment, the processing device 1802 may reside on a first integrated circuit and the main memory 1804 may reside on a second integrated circuit. For example, the integrated circuit may include a host computer (e.g., CPU having one more processing cores, L1 caches, L2 caches, or the like), a host controller or other types of processing devices 1802. The second integrated circuit may include a memory device coupled to the host device, and whose primary functionality is dependent upon the host device, and can therefore be considered as expanding the host device's capabilities, while not forming part of the host device's core architecture. The memory device may be capable of communicating with the host device via a DQ bus and a CA bus. For example, the memory device may be a single chip or a multi-chip module including any combination of single chip devices on a common integrated circuit substrate. The components of FIG. 18 can reside on "a common carrier substrate," such as, for example, an integrated circuit ("IC") die substrate, a multi-chip module substrate or the like. Alternatively, the memory device may reside on one or more printed circuit boards, such as, for example, a mother board, a daughter board or other type of circuit card. In other implementations, the main memory and processing device 1802 can reside on the same or different carrier substrates.

The computer system 1800 may include a chipset 1808, which refers to a group of integrated circuits, or chips, that are designed to work with the processing device 1802 and controls communications between the processing device 1802 and external devices. For example, the chipset 1808 may be a set of chips on a motherboard that links the processing device 1802 to very high-speed devices, such as main memory 1808 and graphic controllers, as well as linking the processing device to lower-speed peripheral buses of peripherals 1810, such as USB, PCI or ISA buses.

The computer system 1800 may further include a network interface device 1822. The computer system 1800 also may include a video display unit (e.g., a liquid crystal display (LCD)) connected to the computer system through a graphics port and graphics chipset, an alphanumeric input device (e.g., a keyboard), a cursor control device (e.g., a mouse), and a signal generation device 1820 (e.g., a speaker.

TERMINOLOGY

In the foregoing description and in the accompanying drawings, specific terminology and drawing symbols have been set forth to provide a thorough understanding of the present invention. In some instances, the terminology and symbols may imply specific details that are not required to practice the invention.

For example, any of the specific numbers of bits, signal path widths, signaling or operating frequencies, component circuits or devices and the like may be different from those described above in alternative embodiments.

Also, the interconnection between circuit elements or circuit blocks shown or described as multi-conductor signal links may alternatively be single-conductor signal links, and single conductor signal links may alternatively be multi-conductor signal links.

Signals and signaling paths shown or described as being single-ended may also be differential, and vice-versa. Similarly, signals described or depicted as having active-high or active-low logic levels may have opposite logic levels in alternative embodiments.

Component circuitry within integrated circuit devices may be implemented using metal oxide semiconductor (MOS) technology, bipolar technology or any other technology in which logical and analog circuits may be implemented.

With respect to terminology, a signal is said to be "asserted" when the signal is driven to a low or high logic state (or charged to a high logic state or discharged to a low logic state) to indicate a particular condition.

Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition).

A signal driving circuit is said to "output" a signal to a signal receiving circuit when the signal driving circuit asserts (or de-asserts, if explicitly stated or indicated by context) the signal on a signal line coupled between the signal driving and signal receiving circuits.

A signal line is said to be "activated" when a signal is asserted on the signal line, and "deactivated" when the signal is de-asserted.

Additionally, the prefix symbol "/" attached to signal names indicates that the signal is an active low signal (i.e., the asserted state is a logic low state).

A line over a signal name (e.g., ' ') is also used to indicate an active low signal. The term "coupled" is used herein to express a direct connection as well as a connection through one or more intervening circuits or structures.

Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A memory module comprising:
a circuit board;
a data buffer component disposed on the circuit board;
a command and address (CA) buffer component disposed on the circuit board; and
a plurality of device sites on the circuit board, wherein the plurality of device sites is coupled to the data buffer component via data lines and coupled to the CA buffer component via a second number of secondary chip select (CS) lines, wherein a third number of the secondary CS lines between the CA buffer component and any combination of two or more device sites of the plurality of device sites is greater than a fourth number of the secondary CS lines between the CA buffer component and a single one device site of the plurality of device sites, wherein each device site of the plurality of device sites comprises a plurality of stacked memory components, wherein each memory component of the plurality of stacked memory components at each of the plurality of device sites connects to a different one of the secondary CS lines, wherein the second number of secondary CS lines equals one-third of a total number of memory components of the plurality of stacked memory components at each of the plurality of device sites of the memory module.

2. The memory module of claim 1, wherein each of the secondary CS lines corresponds to a different rank of the memory module.

3. The memory module of claim 1, wherein each device site of the plurality of device sites comprises at least one of a package stack of the plurality of stacked memory components or a die stack of the plurality of stacked memory components.

4. An apparatus comprising
a motherboard substrate with at least three memory module sockets, wherein at least one of the at least three memory module sockets is populated with a memory module comprising a plurality of device sites, a data buffer component, and a command and address (CA) buffer component, wherein the plurality of device sites is coupled to the data buffer component via data lines and coupled to the CA buffer component via a total number of secondary chip select (CS) lines, wherein a first number of the secondary CS lines between the CA buffer component and any combination of two or more device sites of the plurality of device sites is greater than a second number of the secondary CS lines between the CA buffer component and a single one device site of the plurality of device sites, wherein each device site of the plurality of device sites comprises a plurality of stacked memory components, wherein each memory component of the plurality of stacked memory component at each of the plurality of device sites connects to a different one of the secondary CS lines, wherein the total number of secondary CS lines equals one-third of a total number of memory components of the plurality of stacked memory components at each of the plurality of device sites of the memory module.

5. The apparatus of claim 4, wherein each of the secondary CS lines corresponds to a different rank of the memory module.

6. The apparatus of claim 4, wherein each device site of the plurality of device sites comprises at least one of a package stack of the plurality of stacked memory components or a die stack of the plurality of stacked memory components.

7. The apparatus of claim 4, wherein the at least three memory module sockets comprises a total of six memory module sockets.

8. The apparatus of claim 4, wherein the at least three memory module sockets comprises a total of three memory module sockets.

9. The apparatus of claim 4, wherein the plurality of device sites is part of a six-device memory site.

10. An apparatus comprising
a motherboard substrate with at least three memory module sockets, wherein at least one of the at least three memory module sockets is populated with a memory module comprising a plurality of device sites, a data buffer component, and a command and address (CA) buffer component, wherein the plurality of device sites is coupled to the data buffer component via data lines and coupled to the CA buffer component via chip select (CS) lines, wherein a first number of the CS lines between the CA buffer component and any combination of two or more device sites of the plurality of device sites is greater than a second number of the CS lines between the CA buffer component and a single one device site of the plurality of device sites, wherein the plurality of device sites is part of a six-device memory site, wherein the memory module comprises two additional six-device memory sites, each of the two additional six-device memory sites being coupled to an additional data buffer component and coupled to the CA buffer component.

11. A memory module comprising:

a plurality of module connector pins;

a plurality of memory components;

a command and address (CA) buffer component;

a data buffer component;

a first number of data lines coupled between respective ones of the plurality of module connector pins and the data buffer component;

a second number of data lines coupled between the data buffer component and the plurality of memory components;

a third number of primary chip select (CS) lines coupled between respective ones of the plurality of module connector pins and the CA buffer component; and a fourth number of secondary CS lines coupled between the CA buffer component and the plurality of memory components, wherein the third number of primary CS lines is less than a fifth number of ranks of the memory module, wherein the fourth number of secondary CS lines equals one-third of a total number of memory dies of the plurality of memory components.

12. The memory module of claim 11, wherein each of the plurality of memory components is at least one of a single memory device, a package stack of at least two memory devices, or a die stack of at least two memory devices.

13. The memory module of claim 11, wherein the fourth number of secondary CS lines equals a total number of memory dies of the plurality of memory components coupled to the data buffer component.

14. The memory module of claim 1, further comprising a first number of primary chip select (CS) lines coupled between the CA buffer component and respective ones of a plurality of pins of the circuit board, wherein the first number of primary CS lines is less than a fifth number of ranks of the memory module.

15. The apparatus of claim 4, wherein the motherboard substrate comprises a third number of primary chip select (CS) lines coupled to CA buffer component of the memory module, wherein the third number of primary CS lines is less than a fourth number of ranks of the memory module.

* * * * *